(12) United States Patent
Kim et al.

(10) Patent No.: US 10,084,049 B2
(45) Date of Patent: Sep. 25, 2018

(54) SEMICONDUCTOR DEVICE

(71) Applicant: Samsung Electronics Co., Ltd., Suwon-si (KR)

(72) Inventors: Jin Bum Kim, Seoul (KR); Gyeom Kim, Hwaseong-si (KR); Seok Hoon Kim, Suwon-si (KR); Tae Jin Park, Yongin-si (KR); Jeong Ho Yoo, Seongnam-si (KR); Cho Eun Lee, Pocheon-si (KR); Hyun Jung Lee, Suwon-si (KR); Sun Jung Kim, Suwon-si (KR); Dong Suk Shin, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/685,255

(22) Filed: Aug. 24, 2017

(65) Prior Publication Data
US 2018/0130886 A1 May 10, 2018

(30) Foreign Application Priority Data

Nov. 9, 2016 (KR) .................. 10-2016-0148684

(51) Int. Cl.
| H01L 27/12 | (2006.01) |
| H01L 29/417 | (2006.01) |
| H01L 27/092 | (2006.01) |
| H01L 29/51 | (2006.01) |
| H01L 29/423 | (2006.01) |

(Continued)

(52) U.S. Cl.
CPC .. *H01L 29/41725* (2013.01); *H01L 21/02425* (2013.01); *H01L 21/32053* (2013.01); *H01L 27/0924* (2013.01); *H01L 29/42356* (2013.01); *H01L 29/517* (2013.01); *H01L 2924/0002* (2013.01)

(58) Field of Classification Search
CPC .......... H01L 29/41725; H01L 29/4966; H01L 29/66515; H01L 27/0924; H01L 21/02425; H01L 21/32053
USPC ....................................................... 257/350
See application file for complete search history.

(56) References Cited

U.S. PATENT DOCUMENTS

| 6,768,156 B1 * | 7/2004 | Bhattacharyya ... G11C 16/0466 |
| | | 257/314 |
| 8,026,539 B2 | 9/2011 | Hargrove et al. |

(Continued)

OTHER PUBLICATIONS

Dahal et al., "Metallic Nickel Silicides: Experiments and Theory for NiSi and first principles for other phases", Journal of Alloys & Compounds, vol. 672, pp. 106/116, Feb. 17, 2016.*

(Continued)

*Primary Examiner* — Jami M Valentine
(74) *Attorney, Agent, or Firm* — Muir Patent Law, PLLC

(57) ABSTRACT

A semiconductor device includes: a substrate having an active region; a gate structure disposed in the active region; source/drain regions respectively formed within portions of the active region disposed on both sides of the gate structure; a metal silicide layer disposed on a surface of each of the source/drain regions; and contact plugs disposed on the source/drain regions and electrically connected to the source/drain regions through the metal silicide layer, respectively. The metal silicide layer is formed so as to have a monocrystalline structure.

19 Claims, 27 Drawing Sheets

(51) Int. Cl.
   *H01L 21/02*     (2006.01)
   *H01L 21/3205*   (2006.01)

(56) References Cited

U.S. PATENT DOCUMENTS

| | | | |
|---|---|---|---|
| 8,173,506 | B2 | 5/2012 | Jung et al. |
| 9,257,323 | B2 | 2/2016 | Huang et al. |
| 9,299,704 | B2 | 3/2016 | Ji et al. |
| 9,324,623 | B1 | 4/2016 | Kim et al. |
| 9,397,197 | B1 * | 7/2016 | Guo ................ H01L 29/7853 |
| 9,406,776 | B2 | 8/2016 | Liu et al. |
| 9,728,466 | B1 * | 8/2017 | Mallela ........... H01L 21/82381 |
| 9,859,384 | B2 * | 1/2018 | Mallela ........... H01L 29/41741 |
| 2008/0185656 | A1 * | 8/2008 | Koyama ........... H01L 21/28097 |
| | | | 257/369 |
| 2009/0191707 | A1 * | 7/2009 | Okada ............. H01L 21/28518 |
| | | | 438/664 |
| 2011/0169105 | A1 * | 7/2011 | Okubo ............. H01L 21/28518 |
| | | | 257/411 |
| 2014/0306290 | A1 * | 10/2014 | Alptekin .......... H01L 29/41725 |
| | | | 257/369 |
| 2016/0197074 | A1 | 7/2016 | Lee et al. |
| 2017/0317177 | A1 * | 11/2017 | Mallela ........... H01L 29/41741 |
| 2018/0130886 | A1 * | 5/2018 | Kim .................. H01L 29/41725 |

OTHER PUBLICATIONS

Pierre Francois Morin, et al., *Macroscopic and nanometer scale stress measurement of Ni(Pt)Si silicide: Impact of thermal treatments ranging from millisecond to several hours*, 011211-1~6 J. Vac. Sci. Technol. B 32(1), Jan./Feb. 2014.

* cited by examiner

SEMICONDUCTOR DEVICE

CROSS-REFERENCE TO RELATED APPLICATION

This application claims benefit of priority under 35 USC § 119 to Korean Patent Application No. 10-2016-0148684, filed on Nov. 9, 2016 in the Korean Intellectual Property Office, the disclosure of which is incorporated herein by reference in its entirety.

BACKGROUND

1. Field

The herein described exemplary embodiments relate to a semiconductor device.

2. Description of Related Art

As the demand for high performance, high speed, and multifunctionality in semiconductor devices has increased, the degree of integration of semiconductor devices has increased. When highly integrated, micropattern, semiconductor devices are manufactured, the micropatterns require a microwidth or a microdistance therebetween. To overcome the limitations of planar metal-oxide-semiconductor field-effect transistors (MOSFETs), semiconductor devices including fin field effect transistors (FinFETs), including a channel having a three-dimensional structure, have also been developed.

In general, because a metal silicide layer used as a contact structure has poor thermal stability, a level of contact resistance may be greatly increased by the growth and/or agglomeration of grains that may occur in a subsequent process, such as annealing a gate dielectric layer.

SUMMARY

Herein described exemplary embodiments are directed to a semiconductor device having improved electrical characteristics and reliability by providing a metal silicide layer having excellent thermal stability.

According to an exemplary embodiment, a semiconductor device may include: a substrate having an active region; a gate structure disposed on the active region; source/drain regions respectively formed on portions of the active region at both sides of the gate structure; a metal silicide layer disposed on a surface of each of the source/drain regions and having a monocrystalline structure; and contact plugs disposed on the source/drain regions and electrically connected to the source/drain regions through the metal silicide layer, respectively.

According to an exemplary embodiment, a semiconductor device may include: a substrate having a first device region and a second device region; a first channel-type transistor formed in the first device region; and a second channel-type transistor formed in the second device region, in which each of the first channel-type transistor and the second channel-type transistor includes: a fin-type active region extending in a first direction; a gate line extending in a second direction, substantially perpendicular to the first direction, to intersect the fin-type active region; source/drain regions respectively formed on portions of the fin-type active region at both sides of the gate line; metal silicide layers formed on surfaces of the source/drain regions; contact plugs disposed on the source/drain regions and electrically connected to the source/drain regions through the metal silicide layers, respectively, in which at least one of the metal silicide layers of the first channel-type transistor and the second channel-type transistor is a monocrystalline layer.

BRIEF DESCRIPTION OF DRAWINGS

The above, and other aspects, features, and advantages of the present disclosure will be more clearly understood from the following detailed description when taken in conjunction with the accompanying drawings, in which.

DETAILED DESCRIPTION

The present disclosure now will be described more fully hereinafter with reference to the accompanying drawings, in which various exemplary embodiments are shown. The invention may, however, be embodied in many different forms and should not be construed as limited to the exemplary embodiments set forth herein. These example exemplary embodiments are just that—examples—and many embodiments and variations are possible that do not require the details provided herein. It should also be emphasized that the disclosure provides details of alternative examples, but such listing of alternatives is not exhaustive. Furthermore, any consistency of detail between various exemplary embodiments should not be interpreted as requiring such detail—it is impracticable to list every possible variation for every feature described herein. The language of the claims should be referenced in determining the requirements of the invention.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present.

Spatially relative terms, such as "beneath," "below," "lower," "above," "upper" and the like, may be used herein for ease of description to describe positional relationships, such as illustrated in the figures, e.g. It will be understood that the spatially relative terms encompass different orientations of the device in addition to the orientation depicted in the figures.

Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

Figure 1:
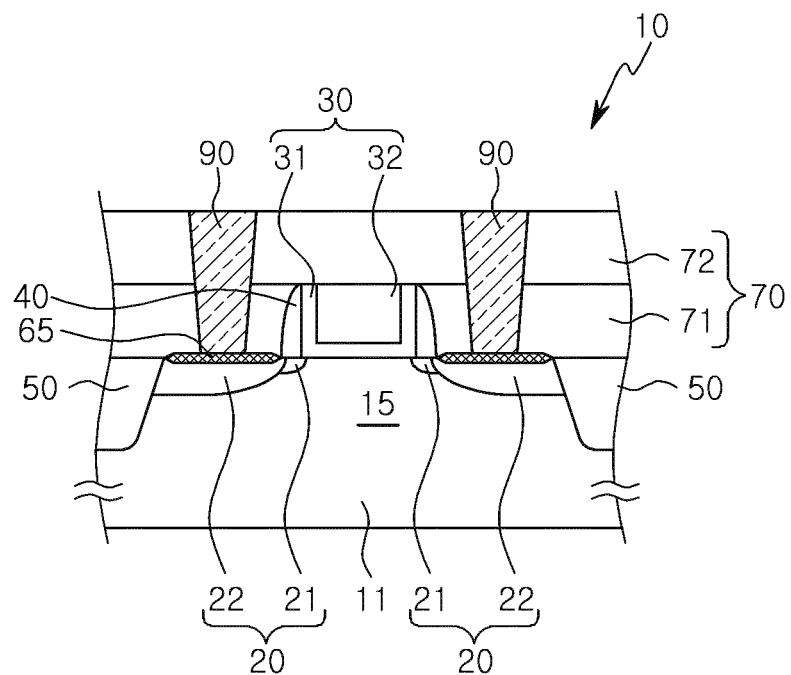
FIG. 1 is a cross-sectional view of a semiconductor device according to an exemplary embodiment.

FIG. 1 is a cross-sectional view of a semiconductor device according to an example embodiment.

As shown in FIG. 1, a semiconductor device 10 may include a substrate 11 having an active region 15, and a gate structure 30 disposed on the active region 15.

The substrate 11 may include a semiconductor material such as silicon (Si) or germanium (Ge), or a compound semiconductor material such as silicon germanium (SiGe), silicon carbon (SiC), gallium arsenide (GaAs), indium arsenide (InAs), or indium phosphide (InP). In some example embodiments, the substrate 11 may have a silicon on insulator (SOI) structure. The substrate 11 may include a well region doped with an impurity in order to form metal oxide semiconductor (MOS) field-effect transistors. For example, the substrate 11 may include an n-type well for forming p-channel metal oxide semiconductor (PMOS) transistors. The active region 15 may be defined by device isolations 50. For example, the active region 15 may include silicon (Si) or silicon germanium (SiGe).

The gate structure 30 may include a gate insulating layer 31 and a gate electrode 32 sequentially disposed on the active region 15. The gate insulating layer 31 may include at least one of a silicon oxide layer, a silicon nitride layer, a silicon oxynitride layer, and a high-k dielectric layer. The high-k dielectric layer may include an insulating material having a dielectric constant greater than that of the silicon oxide layer. For example, the high-k dielectric layer may include at least one of hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof, but the present exemplary embodiment is not limited thereto.

The gate electrode 32 may be disposed on the gate insulating layer 31 and may traverse the active region 15. In some exemplary embodiments, the gate electrode 32 may be formed of a polycrystalline silicon layer doped with an impurity. In another exemplary embodiment, the gate electrode 32 may be formed of a conductive material having relatively low resistivity and a high work function. For example, the gate electrode 32 may include at least one of a metal, such as tungsten (W) or molybdenum (Mo), or a conductive metal compound, such as titanium nitride, tantalum nitride, tungsten nitride, and titanium aluminum nitride.

The gate structure 30 may have spacers 40 disposed on both side walls thereof. The spacers 40 may be a silicon oxide layer or a silicon nitride layer. First and second impurity regions 21 and 22 for source/drain regions 20 may be formed in portions of the active region 15 disposed on both sides of the gate structure 30. The first impurity regions 21 may be a low-concentration doped region formed prior to the formation of the spacers 40, and the second impurity regions 22 may be a high-concentration doped region formed after the formation of the spacers 40. In the case of a PMOS transistor, the first and second impurity regions 21 and 22 may be doped with a p-type impurity such as boron (B).

The source/drain regions 20 may have crystallized metal silicide layers 65 disposed thereon. Each of the metal silicide layers 65 may comprise a contact to facilitate an electrical connection between a source/drain region 20 and a contact plug 90. The metal silicide layers 65 employed in FIG. 1 may have a monocrystalline structure. Such a monocrystalline structure may comprise ordered crystals obtained by an annealing process. The entirety of the metal silicide layers 65 may substantially include a monocrystalline layer.

The metal silicide layers 65 may include a three component system or more. For example, the metal silicide layers 65 may include a composition of $Ni_{1-x}M_xSi$ (0<x<1), and M may include at least one of platinum (Pt), titanium (Ti), ruthenium (Ru), rhodium (Rh), cobalt (Co), hafnium (Hf), tantalum (Ta), erbium (Er), ytterbium (Yb), or tungsten (W).

In some exemplary embodiments, the metal silicide layers 65 may include a composition of $Ni_{1-x}Pt_xSi$ (0.01<x<0.2). The monocrystalline structure of the metal silicide layers 65 may be an orthorhombic system. In the case that the metal silicide layers 65 include other components, the metal silicide layers 65 may have a crystal structure different from the orthorhombic system. In alternative examples, an intrinsic semiconductor material other than silicon may be used to form the layers 65 in accordance with the compositions described herein.

In a subsequent process at a high temperature of, for example, 350° C. or higher, the crystallized metal silicide layer 65 shown in FIG. 1 may have excellent thermal stability to prevent a deterioration in resistance due to agglomeration of grains. For example, when the metal silicide layers 65 include a composition of $Ni_{1-x}Pt_xSi$ having an orthorhombic-system crystal structure, the metal silicide layers 65 may be retained without a small change in resistance, even when being annealed at a high temperature of, for example, 600° C. to 800° C. for tens of seconds, for example, 30 seconds or more.

The substrate 11 may have an interlayer insulating layer 70 disposed thereon. The interlayer insulating layer 70 may include a first interlayer insulating layer 71 disposed around the gate structure 30, and a second interlayer insulating layer 72 disposed on the first interlayer insulating layer 71 to cover the gate structure 30. If necessary, the first interlayer insulating layer 71 may be formed, and then, a process of planarizing the first interlayer insulating layer 71 along with the gate structure 30 may be performed. For example, the first and second interlayer insulating layers 71 and 72 may include a tetraethyl orthosilicate (TEOS) layer, an undoped silicate glass (USG) layer, a phosphosilicate glass (PSG) layer, a borosilicate glass (BSG) layer, a borophosphosilicate glass (BPSG) layer, a fluoride silicate glass (FSG) layer, a spin on glass (SOG) layer, a tonen silazene (TOSZ) layer, or combinations thereof. The first and second interlayer insulating layers 71 and 72 may be formed using a chemical vapor deposition (CVD) process, a spin coating process, or the like.

Contact plugs 90 connected to the source/drain regions 20 may be formed through the first and second interlayer insulating layers 71 and 72, so as to be connected to the metal silicide layers 65. Each of the contact plugs 90 may include a filled conductive material and a conductive barrier layer surrounding the filled conductive material. The metal silicide layers 65 are not limited to regions in which the contact plugs 90 are formed, and may have a wide area over surfaces of the source/drain regions 20. Such a wide area of the metal silicide layers 65 may significantly improve contact resistance.

FIGS. 2A, 2B, 2C, 2D, 2E, 2F, 2G, 2H, 2I, and 2J are cross-sectional views illustrating a method of manufacturing a semiconductor device according to an exemplary embodiment. A semiconductor device manufactured in this exemplary embodiment may be understood as being a field-effect transistor (FET) device such as a metal-oxide-semiconductor field-effect transistor (MOSFET).

Figure 2A:
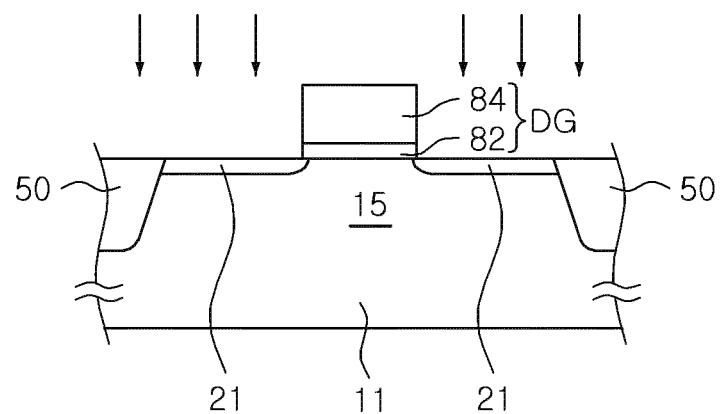
FIGS. 2A, 2B, 2C, 2D, 2E, 2F, 2G, 2H, 2I, and 2J are cross-sectional views illustrating a method of manufacturing a semiconductor device according to an exemplary embodiment.

As illustrated in FIG. 2A, device isolations 50 may be formed in a substrate 11 to define an active region 15, a dummy gate structure DG may be formed on the active region 15, and first impurity regions 21 for source/drain regions 20 (please refer to FIG. 2B) may be formed using the dummy gate structure DG.

Desired device isolations 50 may be provided by etching the substrate 11 to a predetermined depth to form a trench defining the active region 15 and forming an insulating layer such as a silicon oxide layer in the trench using a plasma enhanced chemical vapor deposition (PECVD) process. In the active region 15 of the substrate 11, an n-type well may be formed of an impurity such as phosphorus (P) or arsenic (As) in the case of an n-channel metal oxide semiconductor field effect transistor (n-MOSFET), and a p-type well may be formed of an impurity such as boron (B) in the case of a p-channel metal oxide semiconductor field effect transistor (p-MOSFET). In the case of a complementary MOSFET, this process may allow a first well and a second well having different conductivity types to be formed, and an MOSFET region, as a device isolation region, to be divided into two.

The dummy gate structure DG formed on the active region 15 may define a gate region, and may include a dummy gate insulating layer 82 and a dummy gate electrode 84. The dummy gate insulating layer 82 may include a silicon oxide layer ($SiO_2$). The dummy gate insulating layer 82 may be formed using a CVD process, an atomic layer deposition (ALD) process, or a thermal oxidation process. For example, the dummy gate insulating layer 82 may have a thickness of about 30 Å to about 200 Å. The dummy gate electrode 84 may include polycrystalline silicon formed using a CVD process.

After the formation of the dummy gate structure DG, first impurity regions 21 may be formed in the active region 15 using an ion implantation process. In this process, the first impurity regions 21 may be formed using the dummy gate structure DG as a mask. The first impurity regions 21 may be adjacent to the dummy gate structure DG.

Figure 2B:
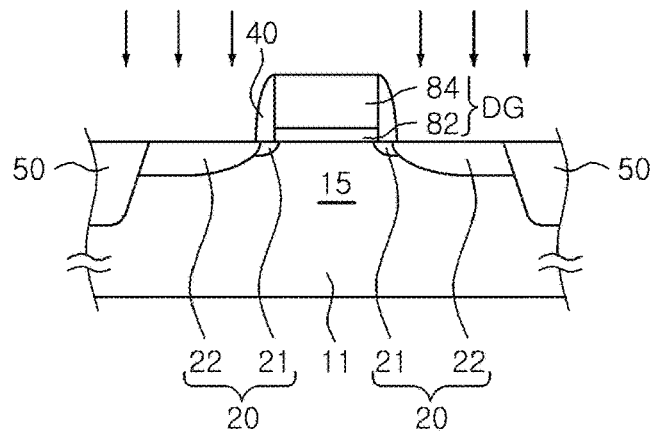

As illustrated in FIG. 2B, spacers 40 may be formed on side walls of the dummy gate structure DG, and second impurity regions 22 may be formed using a second ion implantation process.

The spacers 40 may include silicon oxide, silicon nitride, silicon oxynitride, or combinations thereof. Using the dummy gate structure DG, on which the spacers 40 are formed, as an ion implantation mask, the second impurity regions 22 may be formed in the substrate 11. After the second ion implantation process for the second impurity regions 22, a heat treatment process may be further performed. As described above, the first and second impurity regions 21 and 22 may be provided as the source/drain regions 20.

Figure 2C:
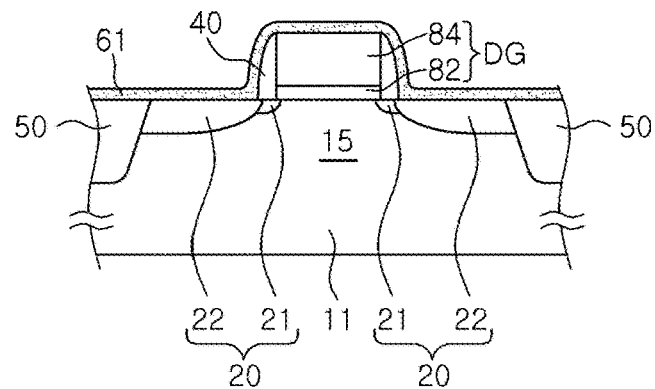

As illustrated in FIG. 2C, a metal layer 61 may be formed on the substrate 11.

The metal layer 61 may surround the dummy gate structure DG, as well as the entirety of the substrate 11 and the source/drain regions 20. The metal layer 61 employed in FIG. 2C may be a metal or alloy that may be monocrystallized, as well as being silicized. For example, the metal layer 61 may include titanium (Ti), cobalt (Co), nickel (Ni), tantalum (Ta), platinum (Pt), or combinations thereof. The metal layer 61 may be formed using a physical vapor deposition (PVD) process. In some exemplary embodiments, the metal layer 61 may be an alloy of two or more metals. For example, the metal layer 61 may include a composition of $Ni_{1-x}M_x$ (0<x<1), and M may include at least one of platinum (Pt), titanium (Ti), ruthenium (Ru), rhodium (Rh), cobalt (Co), hafnium (hf), tantalum (Ta), erbium (Er), ytterbium (Yb), or tungsten (W). In a certain exemplary embodiment, the metal layer 61 may include a composition of $Ni_{1-x}Pt_x$ (0.01<x<0.2).

Figure 2D:
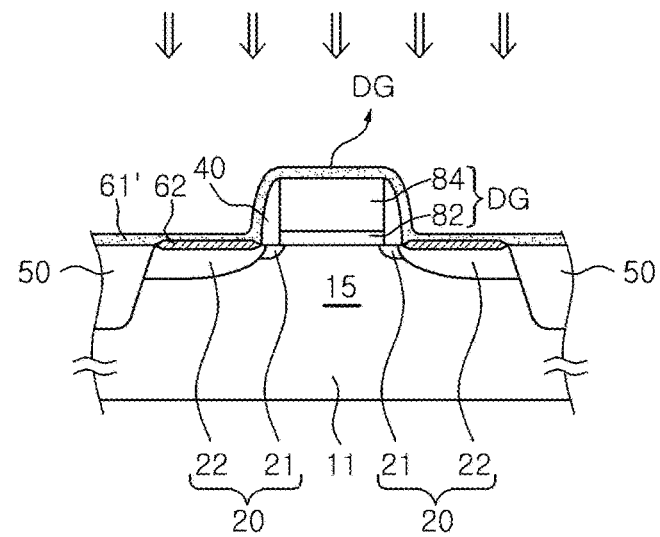

As illustrated in FIG. 2D, a first annealing process in which the metal layer 61 is allowed to react with silicon (the source/drain regions 20) to form silicide layers 62, may be performed.

The first annealing process may be performed at 200° C. to 350° C. The first annealing process may allow regions of the metal layer 61, which contact the source/drain regions 20, to react with silicon (Si) or silicon germanium (SiGe) to form the silicide layers 62. The silicide layers 62 obtained in the first annealing process may be metal-rich amorphous silicide layers. For example, the silicide layers 62 may be amorphous layers having a composition of $Ni_2Pt$. A region of the metal layer 61, which does not contact the source/drain regions 20, may not be silicized, and may be present as a non-reactive metal layer 61'.

Figure 2E:
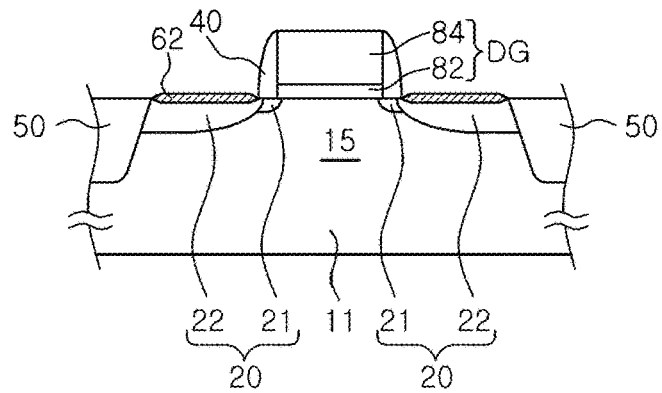

As illustrated in FIG. 2E, a stripping process may be undertaken so that the amorphous silicide layers 62 may remain and the non-reactive metal layer 61' may be removed. The stripping process may be performed as a wet etching process using an etchant such as hydrofluoric acid and/or nitric acid.

Figure 2F:
Figure 2F:
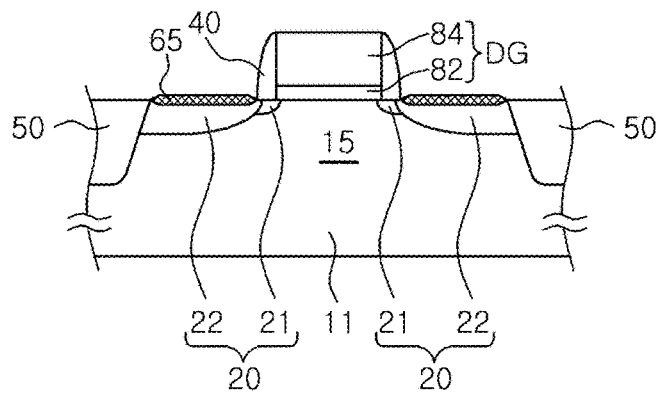

After the stripping process, as illustrated in FIG. 2F, a second annealing process may be undertaken to crystallize the amorphous silicide layers 62, thus obtaining desired monocrystalline silicide layers 65. The second annealing process may be performed at a relatively high temperature in order to crystallize the amorphous silicide layers 62. For example, a millisecond annealing (MSA) process of annealing the amorphous silicide layers 62 in millisecond units at a high temperature of, for example, 1,000° C. or higher, may be used. For example, the MSA process may be performed by applying a heat source (a laser beam) at a temperature of 1,000° C. to 1,400° C. for 0.2 ms to 20 ms. The MSA process may be performed in a laser scanning manner.

In this exemplary embodiment, when the second annealing process is undertaken, the substrate 11 may be maintained at a relatively high temperature. For example, while the substrate 11 is maintained at a temperature of 350° C. or higher, more specifically, 400° C. or higher, the second annealing process may be performed. Such substrate temperature conditions may contribute to sufficiently crystallizing a silicide by reducing a heat release rate at which heat is emitted in a direction of the substrate 11.

An ordered crystalline metal silicide layers 65 aligned by the second annealing process may have a monocrystalline structure. The metal silicide layers 65 may include a three component system or more. For example, the metal silicide layers 65 may include a composition of $Ni_{1-x}M_xSi$ ($0<x<1$), and M may include at least one of platinum (Pt), titanium (Ti), ruthenium (Ru), rhodium (Rh), cobalt (Co), hafnium (Hf), tantalum (Ta), erbium (Er), ytterbium (Yb), or tungsten (W). In a certain example embodiment, when the metal silicide layers 65 include a composition of $Ni_{1-x}Pt_xSi$ ($0.01<x<0.2$), the monocrystalline structure of the metal silicide layers 65 may be an orthorhombic system.

Figure 2G:
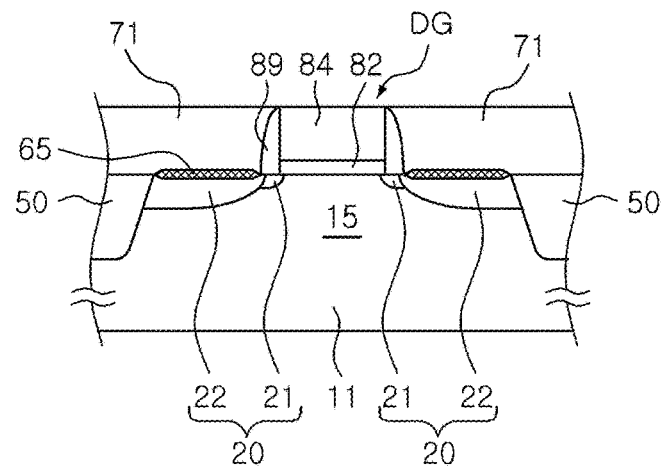

As illustrated in FIG. 2G, a first interlayer insulating layer 71 may be formed on the substrate 11.

For example, the first interlayer insulating layer 71 may include a TEOS layer, a USG layer, a PSG layer, a BSG layer, a BPSG layer, an FSG layer, an SOG layer, a TOSZ layer, or combinations thereof. The first interlayer insulating layer 71 may be formed using a CVD process, a spin coating process, or the like, and may then be planarized so that the dummy gate electrode 84 may be exposed. Such a planarizing process may be performed using a chemical mechanical polishing (CMP) process or an etchback process.

Figure 2H:
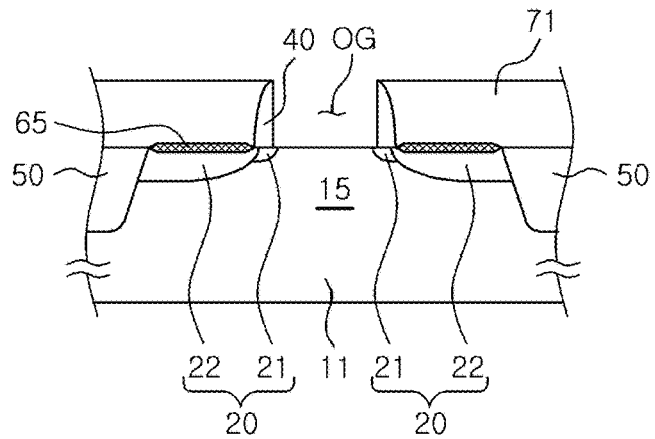

As illustrated in FIG. 2H, a gate opening OG may be formed by removing the dummy gate structure DG.

The gate opening OG may allow a portion of the active region 15 between the source/drain regions 20 to be exposed. In a subsequent process, an actual gate structure may be formed on the portion of the active region 15 exposed by the gate opening OG (refer to FIGS. 2I and 2J). The dummy gate structure DG may be removed using a wet or dry etching process. The first interlayer insulating layer 71 and the spacers 40 may be used as etching masks at the time of removing the dummy gate structure DG.

Figure 2I:
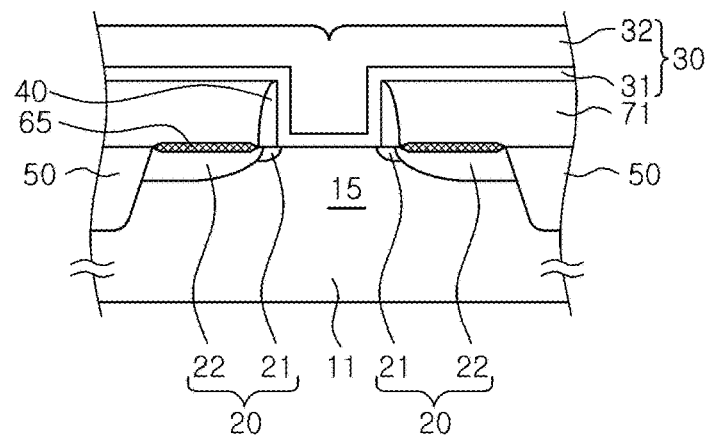

As illustrated in FIG. 2I, a gate insulating layer 31 and a gate electrode 32 may be sequentially formed on the substrate 11.

The gate insulating layer 31 may be the dielectric described in the foregoing exemplary embodiment, and may include a single layer or a plurality of layers. The gate electrode 32 may include, for example, a metal material such as aluminum (Al), tungsten (W), or molybdenum (Mo), or a semiconductor material such as doped polycrystalline silicon. The gate electrode 32 may have a two-layer structure, and may further include, for example, a metal nitride layer such as a titanium nitride (TiN) layer, a tantalum nitride (TaN) layer, or a tungsten nitride (WN) layer, as a layer adjacent to the gate insulating layer 31.

An annealing process for curing the gate insulating layer 31 at a temperature of 350° C. or higher may be performed, and when the gate insulating layer 31 is a high-k dielectric layer, such an annealing process may be performed at a relatively high temperature of 500° C. to 1,300° C. The metal silicide layers 65 according to this exemplary embodiment may be monocrystallized to have excellent thermal stability, thus maintaining low contact resistance characteristics without degrading electrical characteristics, even in a high-temperature annealing process.

Figure 2J:
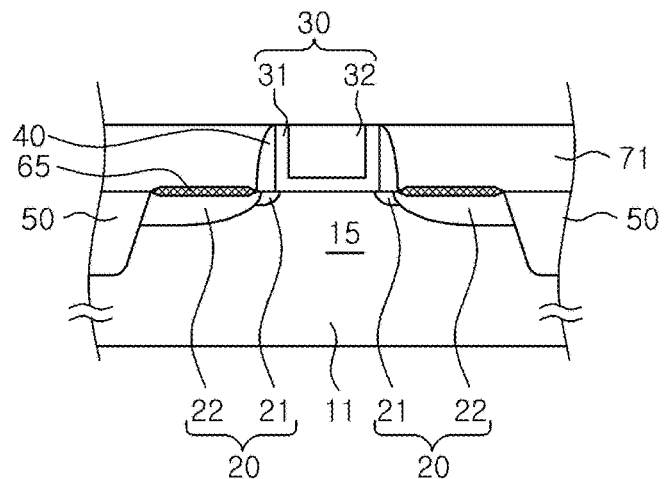

As illustrated in FIG. 2J, a stacked portion of the gate insulating layer 31 and the gate electrode 32 disposed on the first interlayer insulating layer 71 may be removed.

The remainder of the gate structure 30 may be planarized along with an upper surface of the first interlayer insulating layer 71. Such a removal process may be performed using a CMP process or an etchback process.

In a subsequent process, a second interlayer insulating layer 72 may be formed on the first interlayer insulating layer 71, and contact plugs 90 may be formed through the first and second interlayer insulating layers 71 and 72 so as to be connected to the metal silicide layers 65 disposed on the source/drain regions 20. The metal silicide layers 65 may allow the contact plugs 90 and the source/drain regions 20 to be electrically connected to each other.

In order to confirm improvements in thermal stability of the metal silicide layers 65 having ordered crystallinity according to this exemplary embodiment, certain experiments were conducted.

Experiment 1-A

A nickel platinum (NiPt) layer was formed to have a thickness of 15 nm on a silicon (Si) layer, and was then subjected to a first annealing process at 250° C. for 20 seconds to form an amorphous silicide layer. After the first annealing process, a wet etching process was undertaken to remove a non-reactive metal layer that was not silicized, so that only the amorphous silicide layer remained on the silicon (Si) layer.

Subsequently, a second annealing process was performed using a rapid thermal processing (RTP) process, and annealing temperatures, for example, 420° C., 450° C., 500° C., 550° C., and 600° C., were varied for respective samples. Sheet resistances of silicide layers of the samples obtained as described above are shown as "A" in FIG. 3.

Experiment 1-B

Similar to Experiment 1-A, a metal layer deposition process, a first annealing process, and a stripping process for forming an amorphous silicide layer were performed.

Subsequently, the second annealing process was performed using an MSA process including laser scanning, while the substrate was maintained at a temperature of 400° C., and annealing temperatures, for example, 900° C., 1050° C., 1150° C., 1250° C., and 1300° C., were varied for respective samples. Sheet resistances of silicide layers of samples obtained as described above are shown as "B" in FIG. 3.

Figure 3:
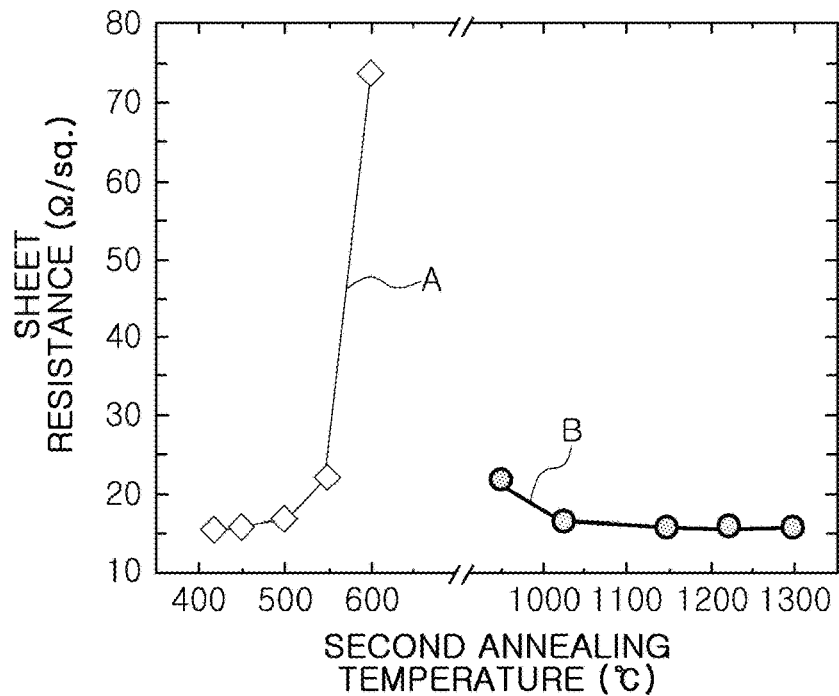
FIG. 3 is a graph illustrating changes in sheet resistance of a metal silicide layer according to second heat treatment conditions.

As shown in the graph of FIG. 3, the metal silicide layer obtained under the annealing conditions (the second annealing process, i.e., the RTP process) according to Experiment 1-A may have a significantly increased level of sheet resistance at a temperature higher than 500° C. Conversely, the metal silicide layer obtained under the annealing conditions (the second annealing process, i.e., the MSA process) according to Experiment 1-B may have a significantly decreased level of sheet resistance at a temperature of 1,000° C. or higher.

Estimation of Thermal Stability of Silicide Layer

One of the samples according to Experiment 1-A (a second annealing temperature: 420° C., "A1") and one of the samples according to Experiment 1-B (a second annealing temperature: 1,150° C., "B1") were exposed to a temperature in a range of 600° C. to 800° C., respectively, for 60 seconds to measure changes in sheet resistances thereof.

Figure 4:
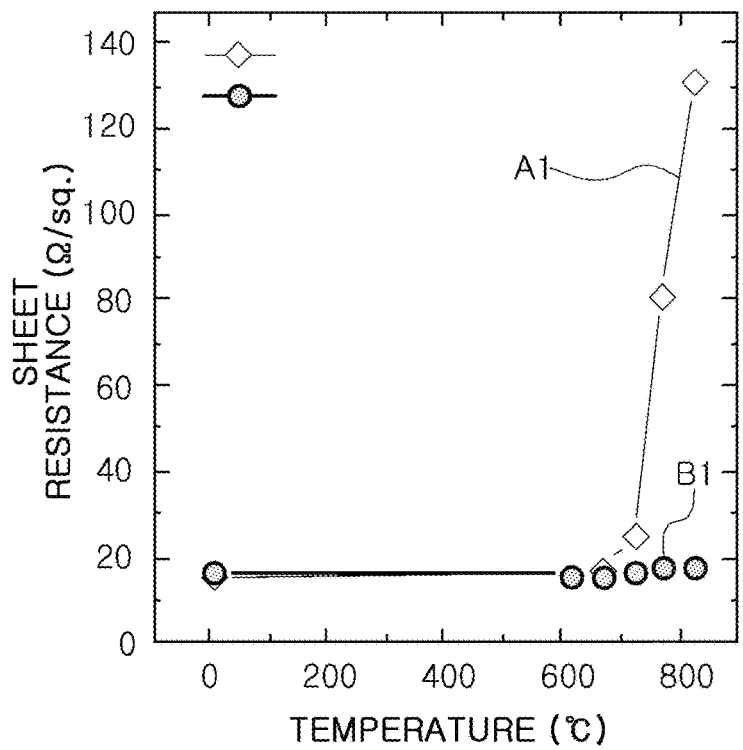
FIG. 4 is a graph illustrating thermal stability of a metal silicide layer based on the Experimental Example and the Comparative Example, according to an exemplary embodiment.

After the thermal exposure process, the measured sheet resistance results of the respective samples A1 and B1 are shown in a graph of FIG. 4.

As shown in FIG. 4, the silicide layer of sample A1 may have a rapidly increased level of sheet resistance at a temperature higher than 600° C., so that electrical characteristics of the silicide layer are lost in terms of a contact material. In contrast, the silicide layer of sample B1 may be maintained to have an initial sheet resistance value at 800° C., thus having significantly improved thermal stability.

Determination of Crystallinity of Silicide Layer

In order to confirm a reason for which thermal stability of sample B1 is improved, as compared to sample A1, according to the conditions of this exemplary embodiment, transmission electron microscope (TEM) images of the respective samples A1 and B1 were captured and SIMS analysis was performed thereon.

Figure 5A:
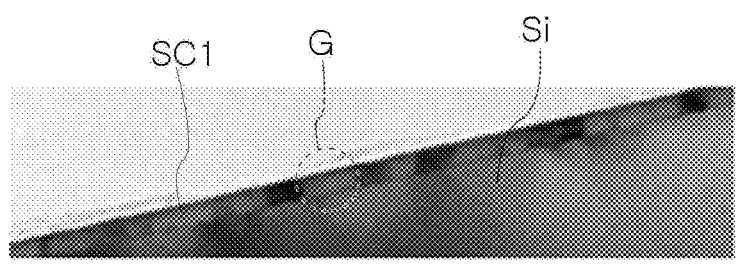
FIGS. 5A and 5B are transmission electron microscope (TEM) images of a metal silicide layer based on the Experimental Example and the Comparative Example, according to an exemplary embodiment.
Figure 5B:
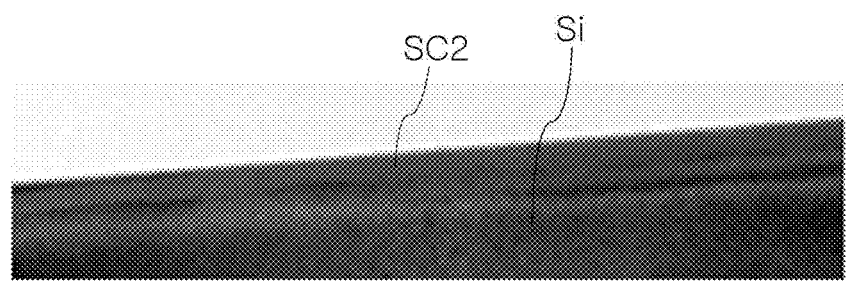
Figure 6A:
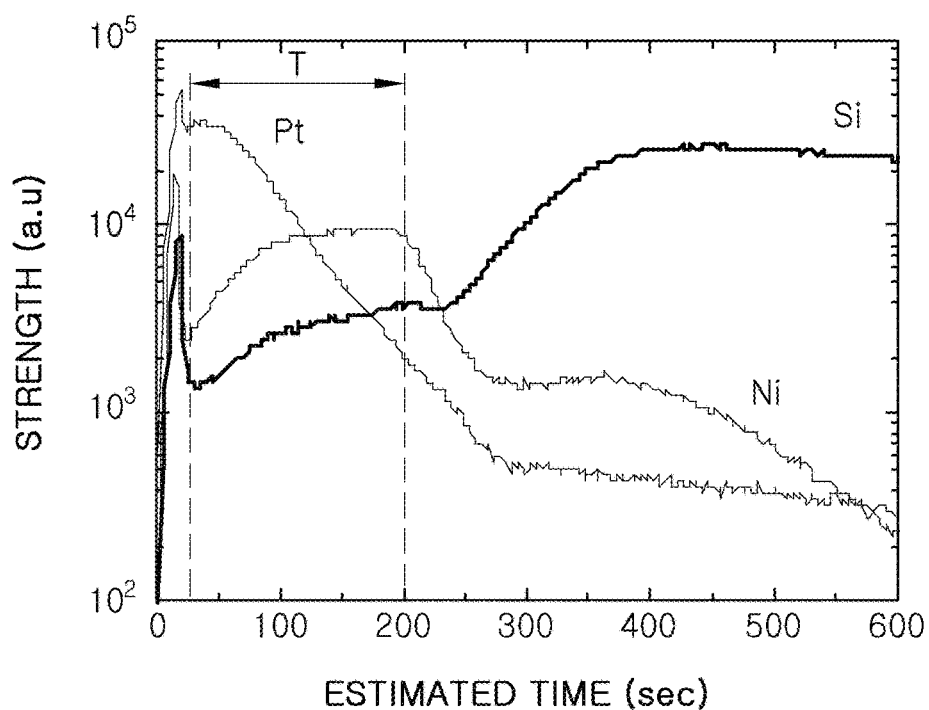
FIGS. 6A and 6B are graphs illustrating silicon photomultiplier (SiPM) analysis results of a metal silicide layer based on the Experimental Example and the Comparative Example according to an exemplary embodiment.
Figure 6B:
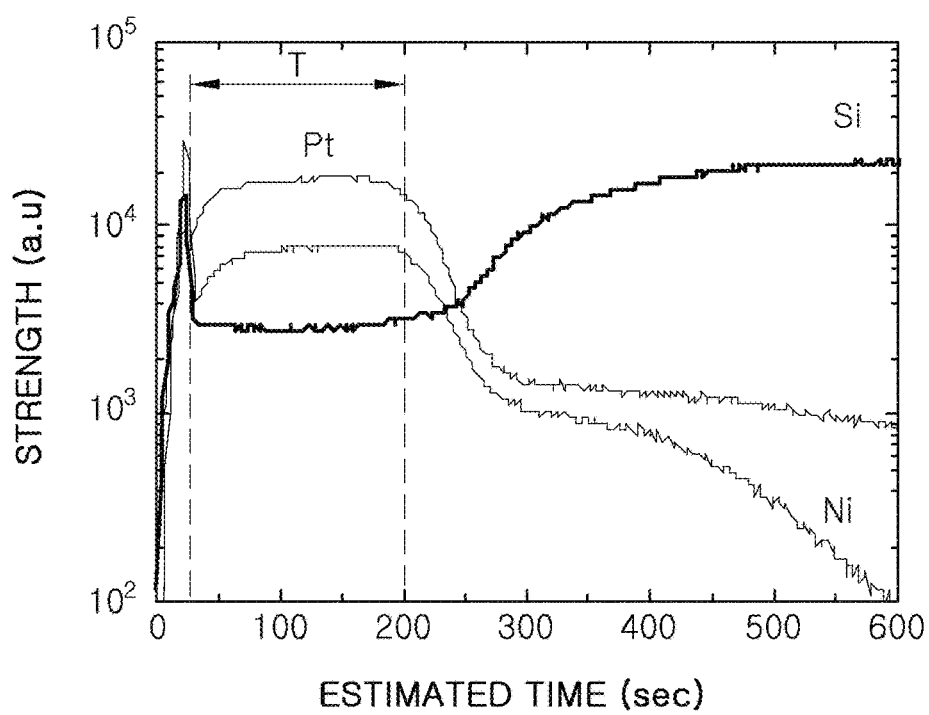

FIGS. 5A and 5B are TEM images obtained by imaging metal silicide layers based on the Experimental Example and the Comparative Example according to an exemplary embodiment, and FIGS. 6A and 6B are SIMS analysis results of the metal silicide layers based on the Experimental Example and the Comparative Example according to an exemplary embodiment.

As shown in FIG. 5A, sample A1 may have a nickel platinum silicon (NiPtSi) silicide layer SC1 formed on the silicon (Si) layer thereof, and may include polycrystals having a grain G size of less than or equal to 30 nm. In contrast, as shown in FIG. 5B, a silicide layer SC2 of sample B1 may include entirely aligned monocrystals.

As shown in FIG. 6A, detected amounts of components such as nickel (Ni), platinum (Pt), and silicon (Si) included in sample A1 may be rapidly changed over time in an etching section T of the silicide layer. Thus, depending on a thickness of the silicide layer, the respective components may be non-uniformly distributed. This indicates that the silicide layer has not been monocrystallized.

In contrast, as shown in FIG. 6B, detected amounts of components such as nickel (Ni), platinum (Pt), and silicon (Si) included in sample B1 may be substantially constantly maintained in the same etching section T as the silicide layer of sample A1, and a uniform distribution of the components, depending on a thickness of the silicide layer of sample B1, indicates that substantially the entirety of the silicide layer thereof has been monocrystallized.

As described above, the monocrystallization of the metal silicide layer may allow excellent thermal stability to be secured.

Figure 7:
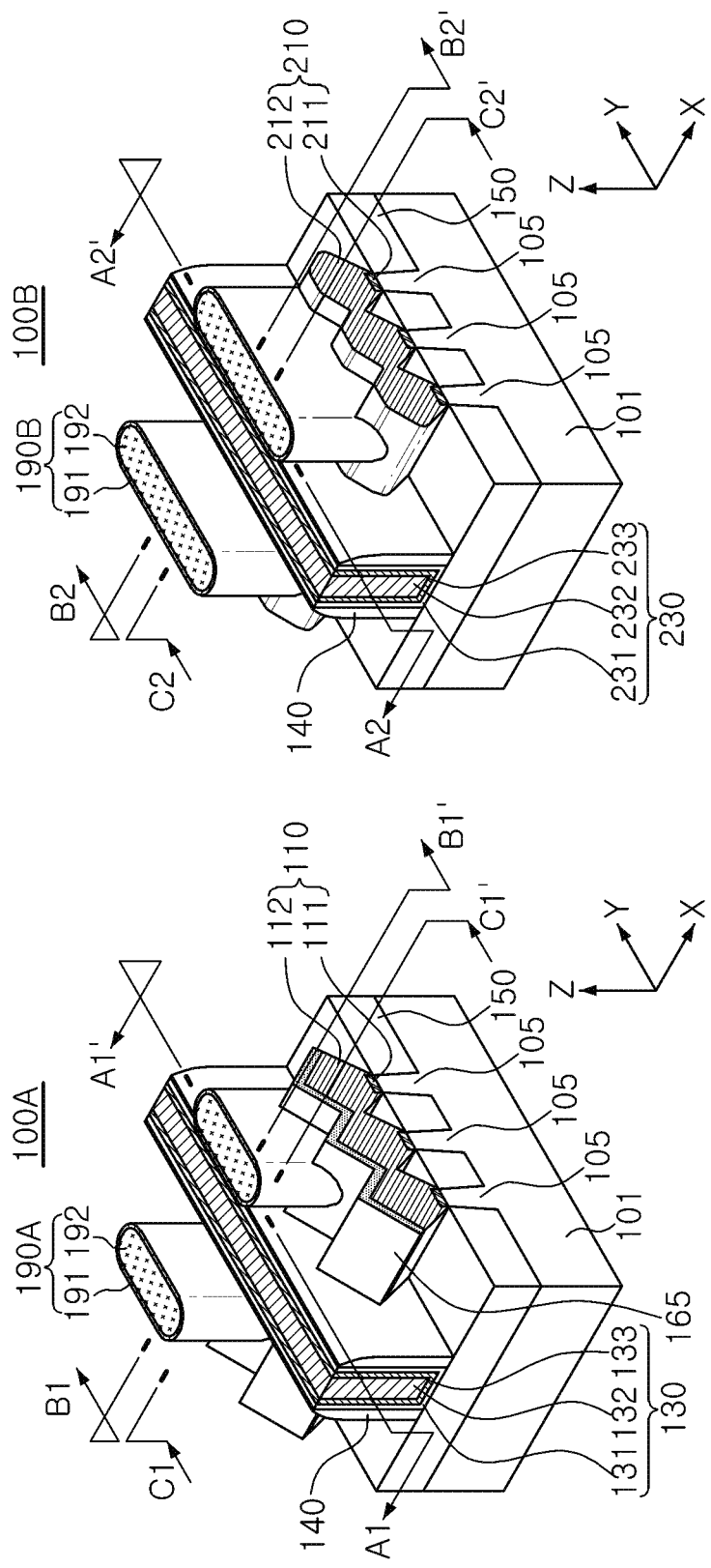
FIG. 7 is cross-sectional views of semiconductor devices according to an exemplary embodiment.
Figure 8A:
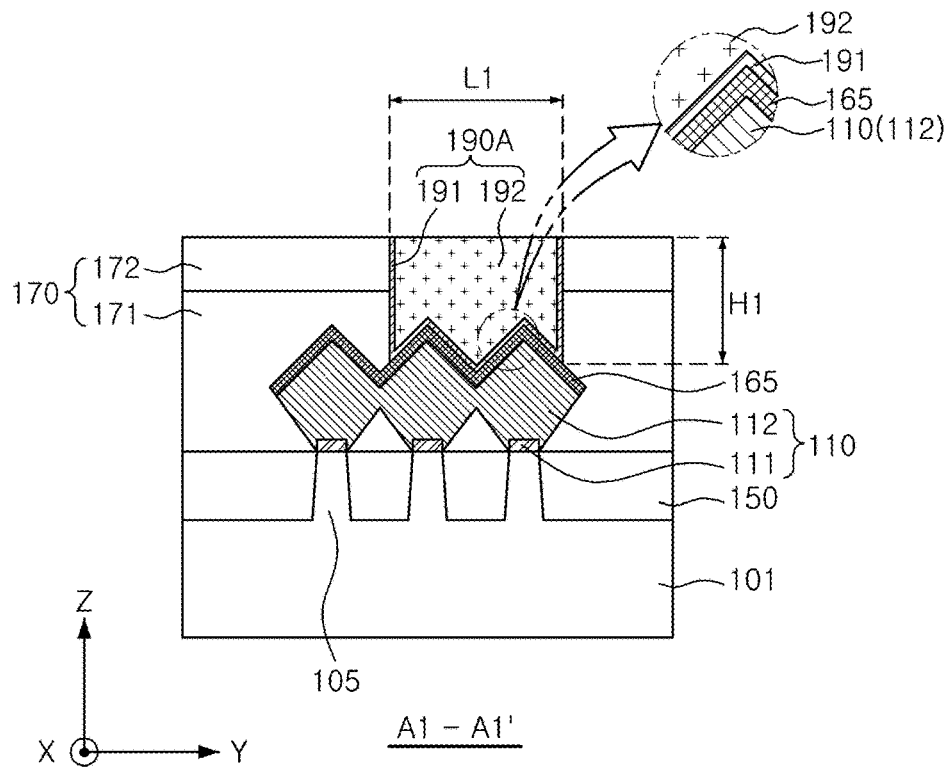
FIG. 8A is a cross-sectional view taken along line A1-A1' of a device region of one of the semiconductor devices illustrated in FIG. 7.
Figure 8B:
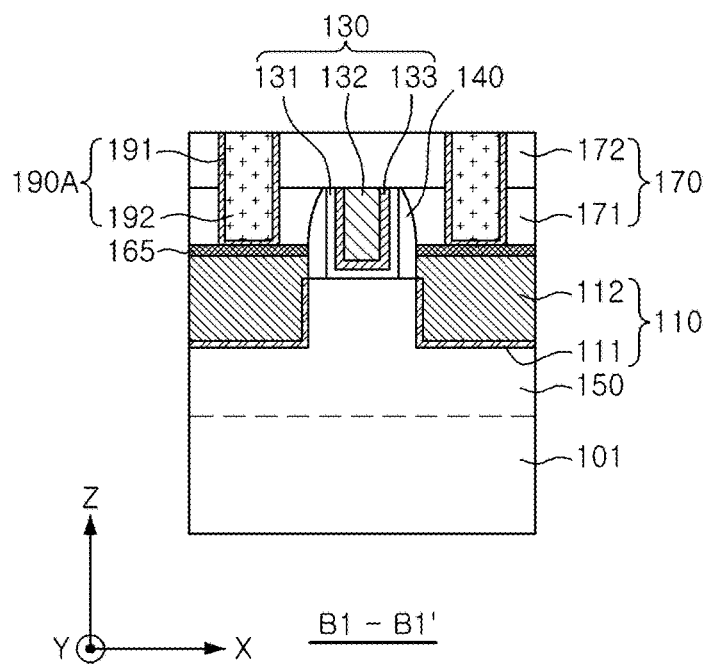
FIG. 8B is a cross-sectional view taken along line B1-B1' of the device region of the one semiconductor device illustrated in FIG. 7.
Figure 8C:
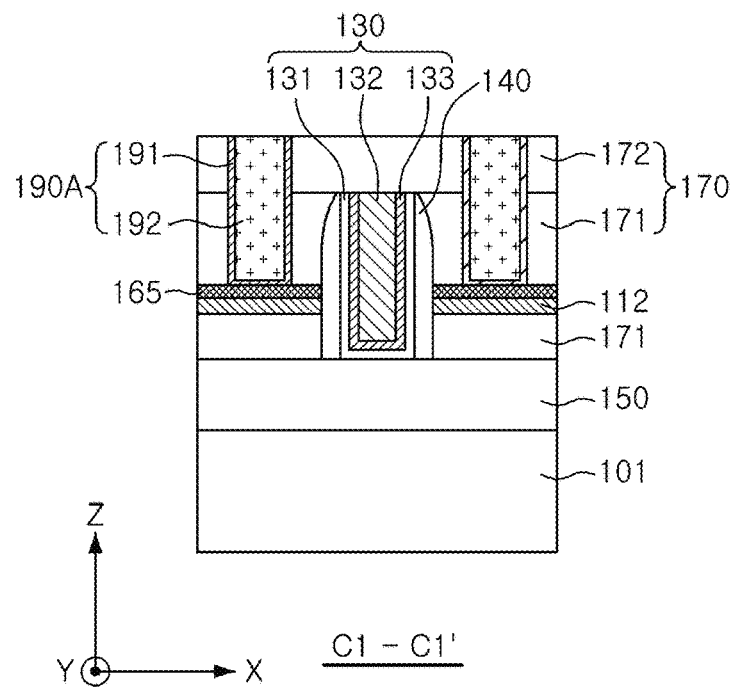
FIG. 8C is a cross-sectional view taken along line C1-C1' of the device region of the one semiconductor device illustrated in FIG. 7.
Figure 9A:
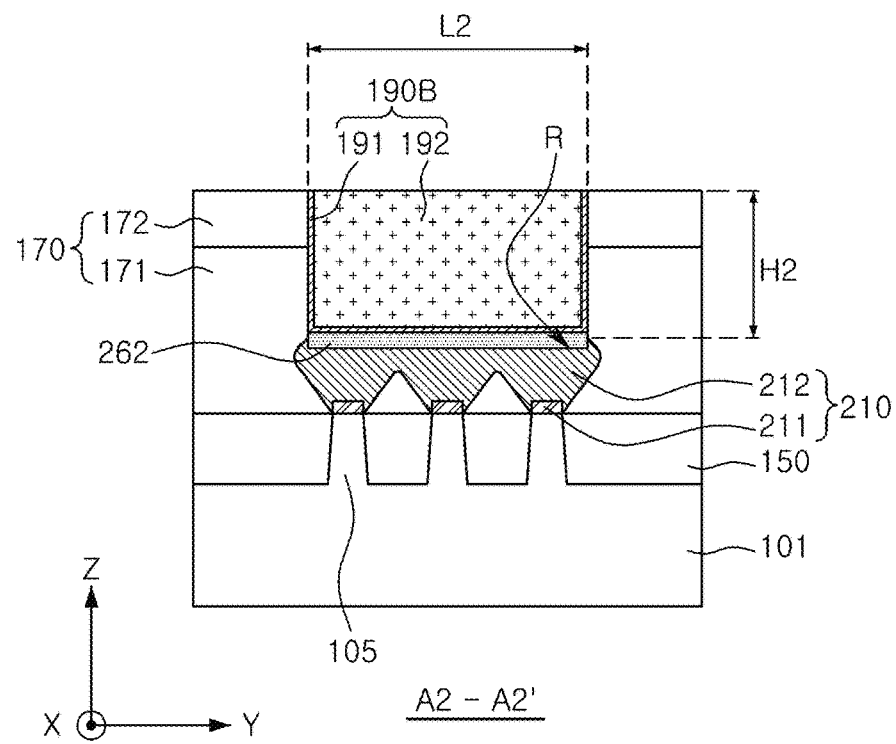
FIG. 9A is a cross-sectional view taken along line A2-A2' of a device region of the other semiconductor device illustrated in FIG. 7.
Figure 9B:
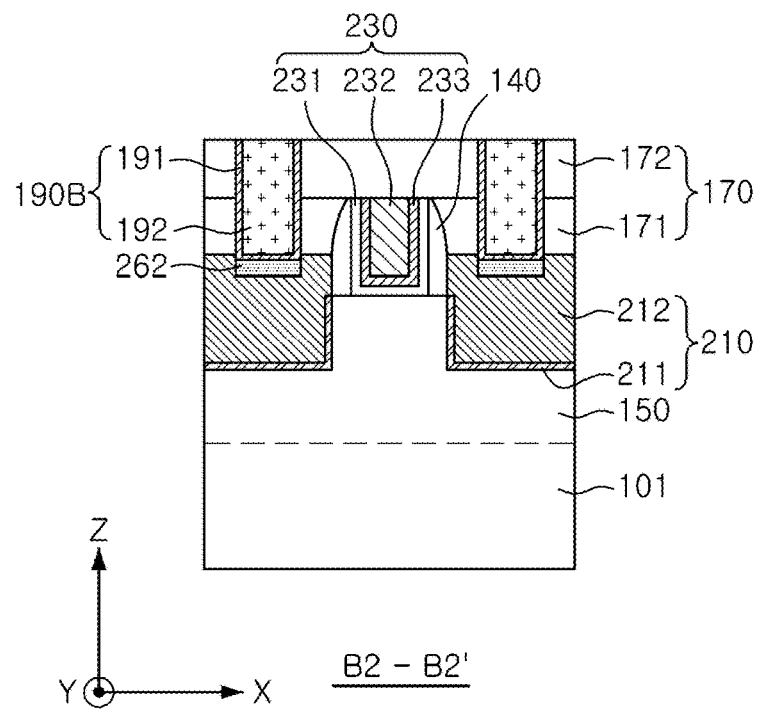
FIG. 9B is a cross-sectional view taken along line B2-B2' of the device region of the other semiconductor device illustrated in FIG. 7.
Figure 9C:
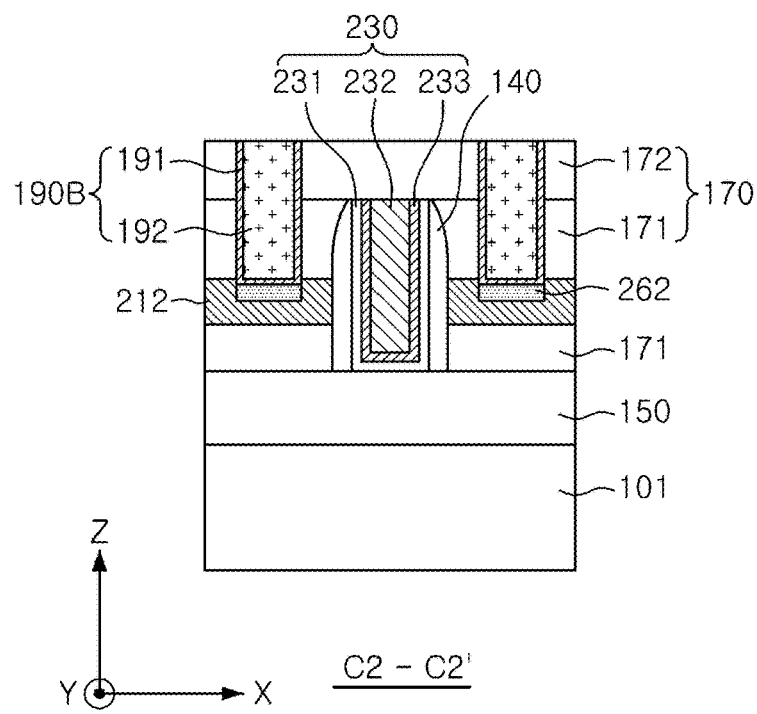
FIG. 9C is a cross-sectional view taken along line C2-C2' of the device region of the other semiconductor device illustrated in FIG. 7.

FIG. 7 is cross-sectional views of semiconductor devices according to an exemplary embodiment. FIGS. 8A through 8C are cross-sectional views taken along lines A1-A1', B1-B1', and C1-C1' of one device region of one semiconductor device illustrated in FIG. 7. FIGS. 9A through 9C are cross-sectional views taken along lines A2-A2', B2-B2', and C2-C2' of the other device region of the other semiconductor device illustrated in FIG. 7.

As shown in FIG. 7, a semiconductor device according to an exemplary embodiment may include a first device region, for example, a PMOS region, and a second device region, for example, an NMOS region. Thus, the first and second device regions may have first and second semiconductor devices 100A and 100B formed therein, respectively, with the first and second semiconductor devices 100A and 100B divided into certain channel types. For example, the first semiconductor device 100A may be a PMOS transistor, and the second semiconductor device 100B may be an NMOS transistor.

As illustrated in FIG. 7, each of the first and second semiconductor devices 100A and 100B may include a plurality of fin-type active regions 105 formed on a substrate 101 while extending in a first direction (an X direction), and device isolations 150 formed on the substrate 101 while covering side walls of the fin-type active regions 105. The device isolations 150 may include an insulating material such as silicon oxide, silicon nitride, or silicon oxynitride.

The first semiconductor device 100A may include first source/drain regions 110 formed on the fin-type active regions 105, and a first gate structure 130 disposed between the first source/drain regions 110 while extending in a second direction (a Y direction) to intersect the fin-type active regions 105. The first source/drain regions 110 may be formed of silicon germanium (SiGe), and may be doped with a p-type impurity, such as boron (B), indium (In), gallium (Ga), and boron trifluoride ($BF_3$).

Similar to the first semiconductor device 100A, the second semiconductor device 100B may include second source/drain regions 210 formed on fin-type active regions 105, and second gate structure 230 disposed between the second source/drain regions 210 while extending in a second direction (a Y direction) to intersect the fin-type active regions 105. The second source/drain regions 210 may be formed of silicon (Si), and may be doped with an n-type impurity, such as phosphorus (P), nitrogen (N), arsenic (As), and antimony (Sb).

Each of the first and second gate structures may have spacers 140 formed on side surfaces thereof, respectively. The first and second gate structures 130 and 230 may include gate insulating layers 131 and 231, first gate electrodes 132 and 232, and second gate electrodes 133 and 233, respectively. Each of the first and second gate structures 130 and 230 may extend in the Y direction while covering portions of an upper surface and both side walls of each of the fin-type active regions 105 and portions of upper surfaces of the device isolations 150. Regions, in which the fin-type active regions 105 and the first and second gate structures 130 and 230 intersect, may have a plurality of MOS transistors formed therein. Each of the MOS transistors may be provided as an MOS transistor having a three-dimensional structure in which channels are formed on the upper surface and both side walls of each of the fin-type active regions 105.

The gate insulating layers 131 and 231 may include a silicon oxide layer, a high-k dielectric layer, or combinations thereof. The high-k dielectric layer may include a material having a dielectric constant of, for example, about 10 to about 25, higher than that of a silicon oxide layer. For example, the material described in the foregoing example embodiment may be used as the high-k dielectric layer. The gate insulating layers 131 and 231 may be formed using an ALD process, a CVD process, or a PVD process.

The first gate electrodes 132 and 232 may function to adjust a work function. The second gate electrodes 133 and 233 may function to fill spaces formed on the first gate electrodes 132 and 232. The first gate electrodes 132 and 232 may function as an antidiffusion layer for the second gate electrodes 133 and 233, but the present inventive concept is not limited thereto. For example, the first gate electrodes 132 and 232 may include a metal nitride such as a titanium nitride (TiN), a tantalum nitride (TaN), or a tungsten nitride (WN). For example, the second gate electrodes 133 and 233 may include a metal material such as aluminum (Al), tungsten (W), or molybdenum (Mo), or a semiconductor material such as doped polycrystalline silicon.

In some exemplary embodiments, at least a portion of the fin-type active regions 105 may be formed over the PMOS region and the NMOS region, and may be shared by the first and second semiconductor devices 100A and 100B. In some exemplary embodiments, at least a portion of the gate insulating layers 131 and 231, the first gate electrodes 132 and 232, and the second gate electrodes 133 and 233 of the first and second gate structures 130 and 230 may include different materials.

As illustrated in FIG. 7, the first and second semiconductor devices 100A and 100B may include first and second contacts 190A and 190B, respectively, and the first and second contacts 190A and 190B may be connected to the first and second source/drain regions 110 and 210, respectively. The first and second contacts 190A and 190B may each include contact plugs 192 and conductive barrier layers 191 surrounding the contact plugs 192, respectively. For example, the contact plugs 192 may include tungsten (W), copper (Cu), aluminum (Al), alloys thereof, or combinations thereof. The conductive barrier layers 191 may include conductive metal nitride layers. For example, the conductive barrier layers 191 may include titanium nitride (TiN), tantalum nitride (TaN), aluminium nitride (AlN), tungsten nitride (WN), or combinations thereof.

As shown in FIGS. 7, 8A, and 9A, the first and second source/drain regions 110 and 210 may include first regions 111 and 211 and second regions 112 and 212 as epitaxial growth layers, respectively. The first regions 111 and 211 may be grown from the fin-type active regions 105, and the second regions 112 and 212 may be grown from the first regions 111 and 211. The first and second regions 111, 211, 112, and 212 may have different impurity concentrations or different materials.

The first and second source/drain regions 110 and 210 may be shaped as elevated or raised source/drain regions disposed higher than lower surfaces of the first and second gate structures 130 and 230, respectively (refer to FIGS. 8B, 8C, 9B, and 9C). For example, elevated or raised first and second source/drain regions 110 and 210, i.e., elevated or raised second regions 112 and 212, may have one of a polygonal shape (a pentagonal or hexagonal shape), a circular shape, and a rectangular shape.

The first and second source/drain regions 110 and 210 may have a structure in which regions, formed from the respective three fin-type active regions 105, may be connected or merged with one another in the Y direction. The number of fin-type active regions 105 related to the merged first and second source/drain regions 110 and 210 may vary according to exemplary embodiments.

The second source/drain regions 210 may have a material and/or shape different from that of the first source/drain regions 110.

For example, when the first semiconductor device 100A is a PMOS transistor, the first source/drain regions 110 may include silicon germanium (SiGe), and may be doped with a p-type impurity. According to exemplary embodiments, the first and second regions 111 and 112 may have different impurity concentrations or different germanium (Ge) contents. For example, when the second semiconductor device 100B is an NMOS transistor, the second source/drain regions 210 may include silicon (Si), and may be doped with an n-type impurity. According to exemplary embodiments, the first and second regions 211 and 212 may have different impurity concentrations.

As illustrated in FIG. 8A, the first source/drain regions 110 may have a structure in which three pentagonal shapes are merged, and conversely, as illustrated in FIG. 9A, the second source/drain regions 210 may have a structure in which a recess R is formed in an upper surface of a structure of merged polygonal shapes.

As shown in FIGS. 7 and 8A, the first semiconductor device 100A may include first silicide layers 165 disposed between the first source/drain regions 110 and the first contacts 190A. The first silicide layers 165 may be formed on surfaces of the second regions 112 obtained by a selective epitaxial growth (SEG) process. For example, the first silicide layers 165 may be formed on crystal planes of merged source/drain regions.

As described above, the first silicide layers 165 may be formed over substantially the entirety of upper surfaces of the first source/drain regions 110. A voltage applied to the first contacts 190A may be supplied to the first source/drain regions 110 through the first silicide layers 165, and thus, a contact area may be increased.

The first silicide layers 165 may have a monocrystalline structure having excellent thermal stability, and may include a monocrystalline layer over substantially the entirety thereof.

For example, the first silicide layers 165 may include a composition of $Ni_{1-x}M_xSi$ (0<x<1), and M may include at least one of platinum (Pt), titanium (Ti), ruthenium (Ru), rhodium (Rh), cobalt (Co), hafnium (Hf), tantalum (Ta)Ta, erbium (Er), ytterbium (Yb), or tungsten (W). In some exemplary embodiments, the first silicide layers 165 may include a composition of $Ni_{1-x}Pt_xSi$ (0.01<x<0.2). The monocrystalline structure of the first silicide layers 165 may be an orthorhombic system.

As in this exemplary embodiment, when the first source/drain regions 110 include silicon germanium (SiGe), the first silicide layers 165 may include a metal silicide layer containing germanium (Ge). For example, the first silicide layers 165 may include a composition of $Ni_{1-x}Pt_xSi(Ge)$. In a subsequent process at a high temperature of, for example, 350° C. or higher, a crystallized metal silicide layer according to this exemplary embodiment may have excellent thermal stability to prevent a deterioration in resistance due to agglomeration.

Figure 10A:
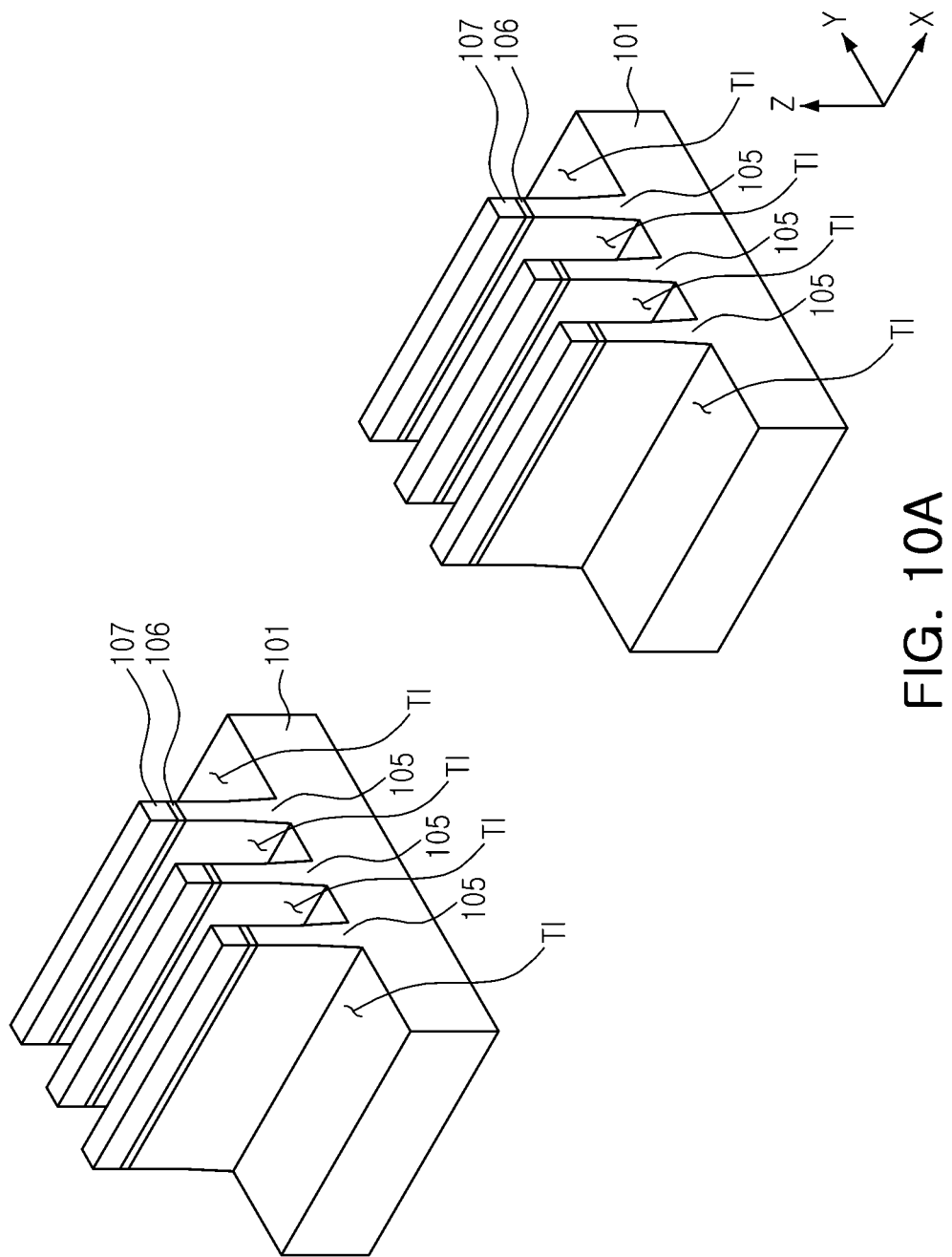
FIGS. 10A, 10B, 10C, 10D, 10E, 10F, 10G, 10H, 10I, 10J, 10K, and 10L are perspective views illustrating a method of manufacturing a semiconductor device according to an exemplary embodiment.
Figure 10B:
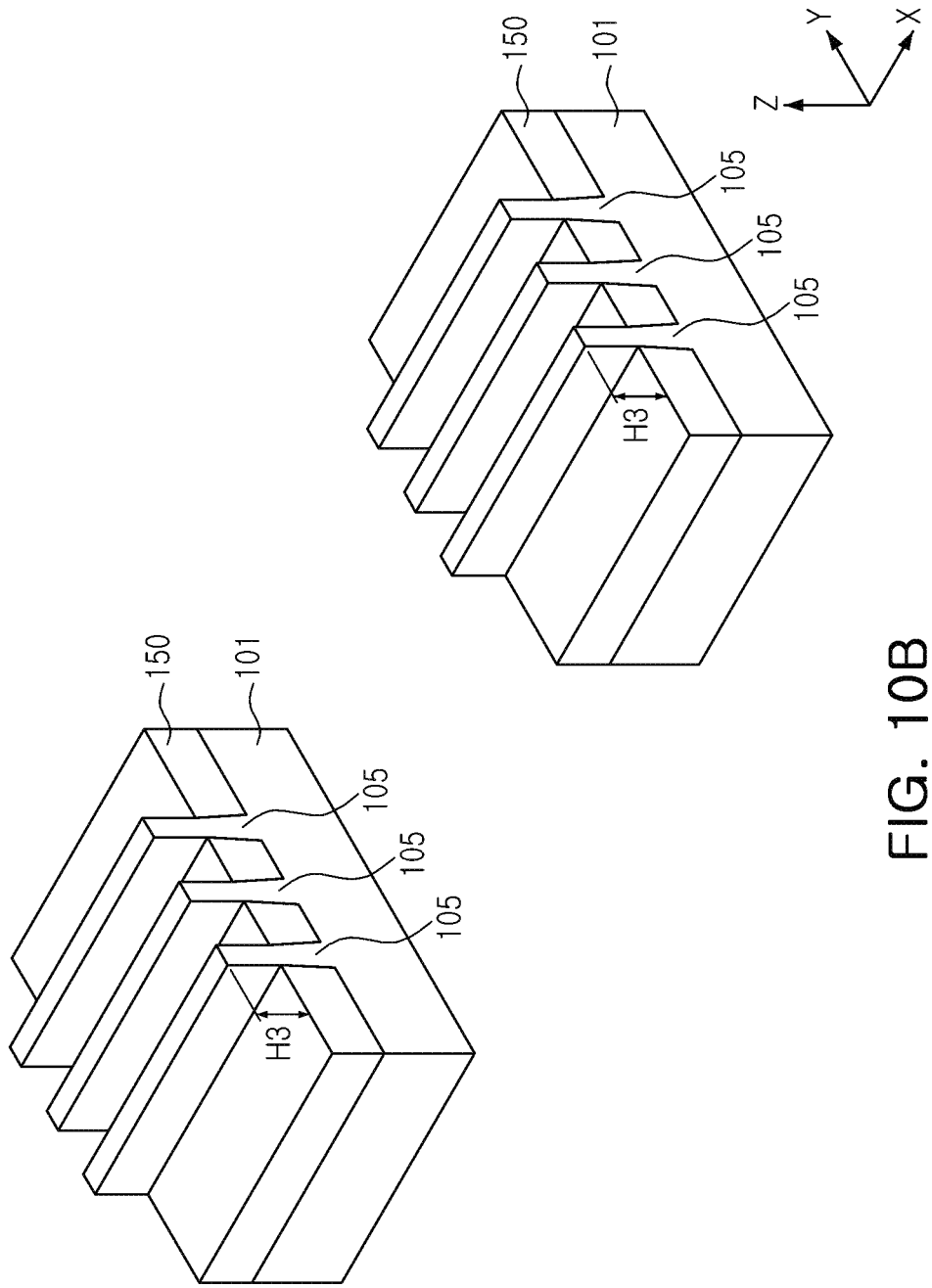
Figure 10C:
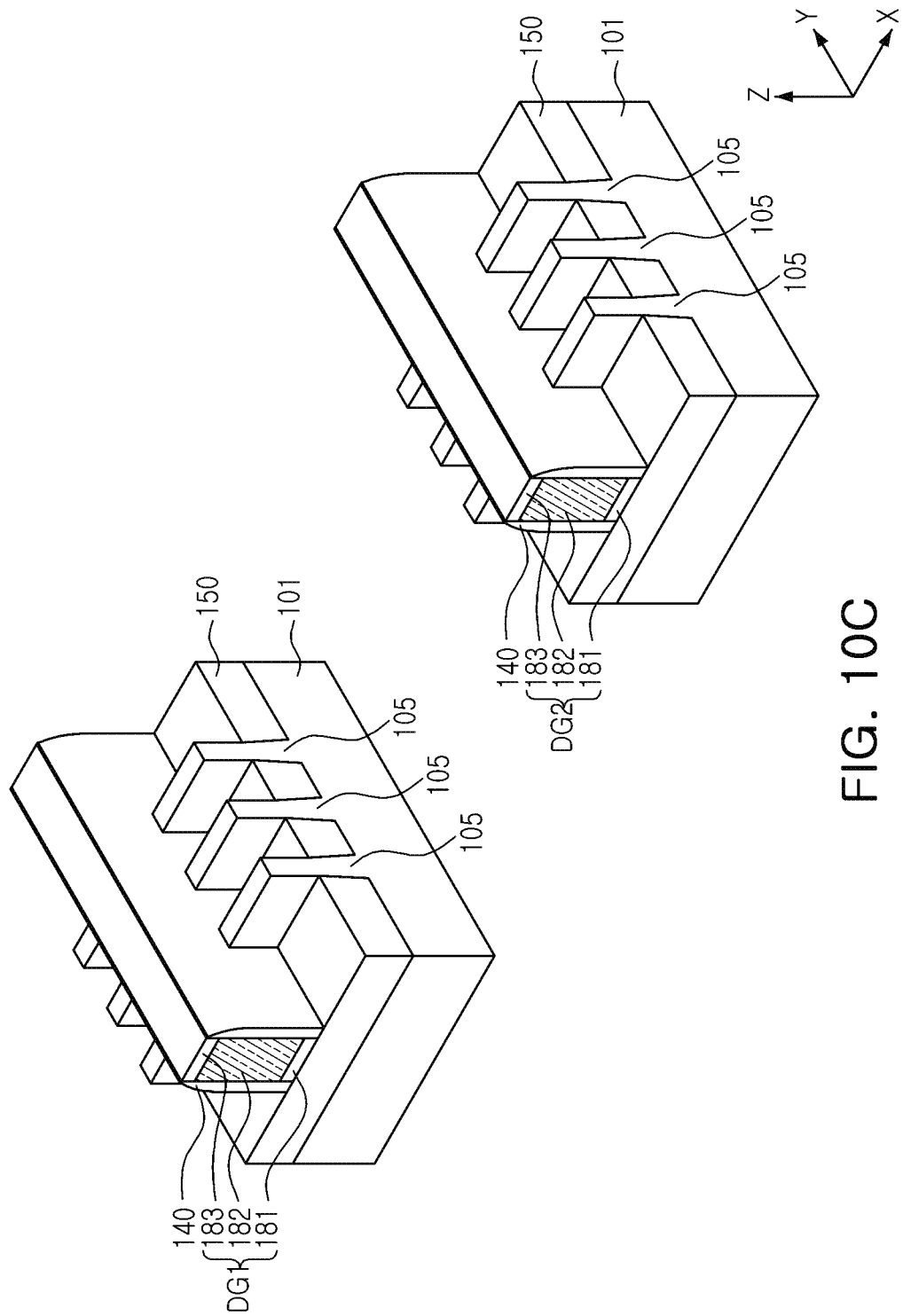
Figure 10D:
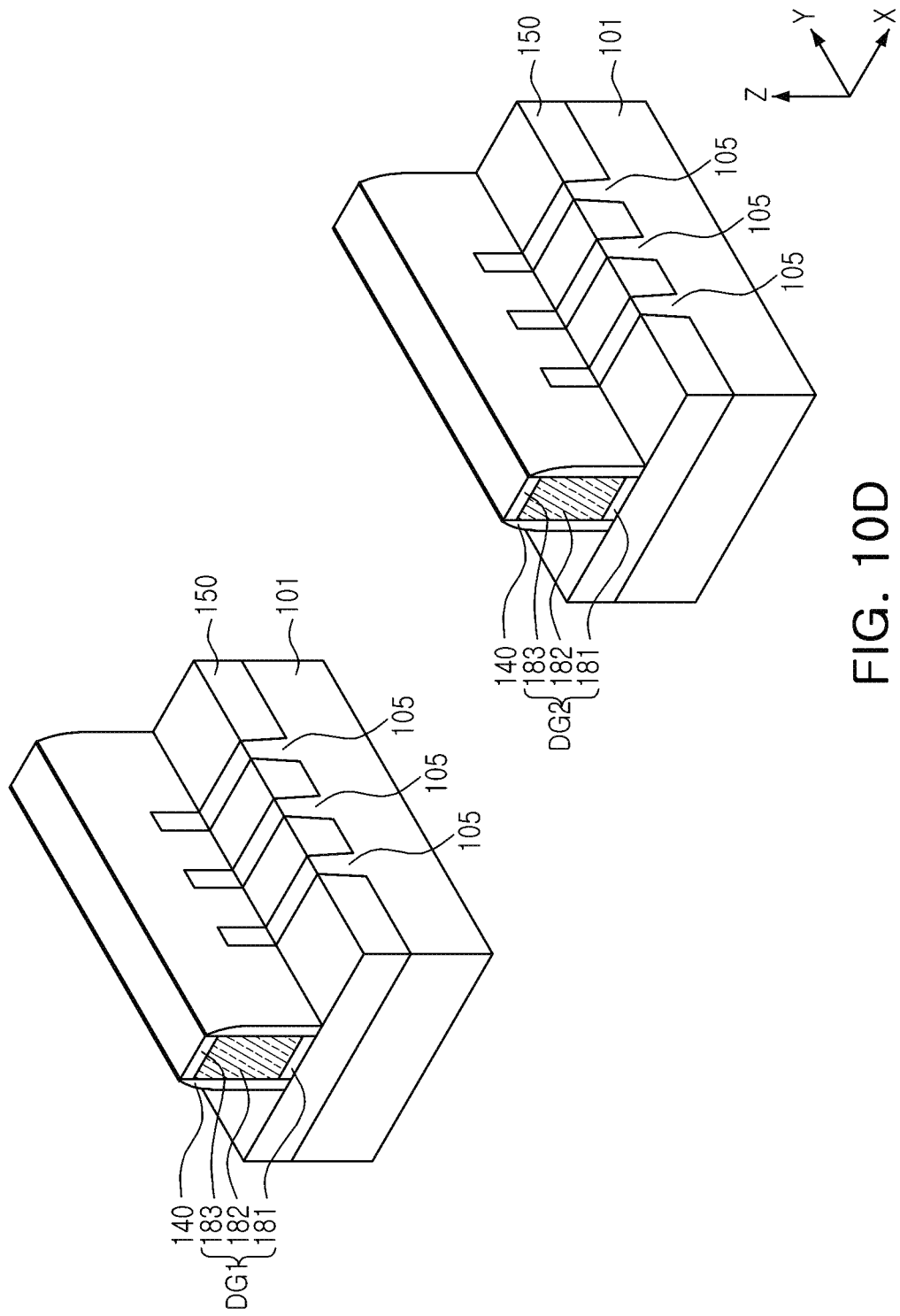
Figure 10E:
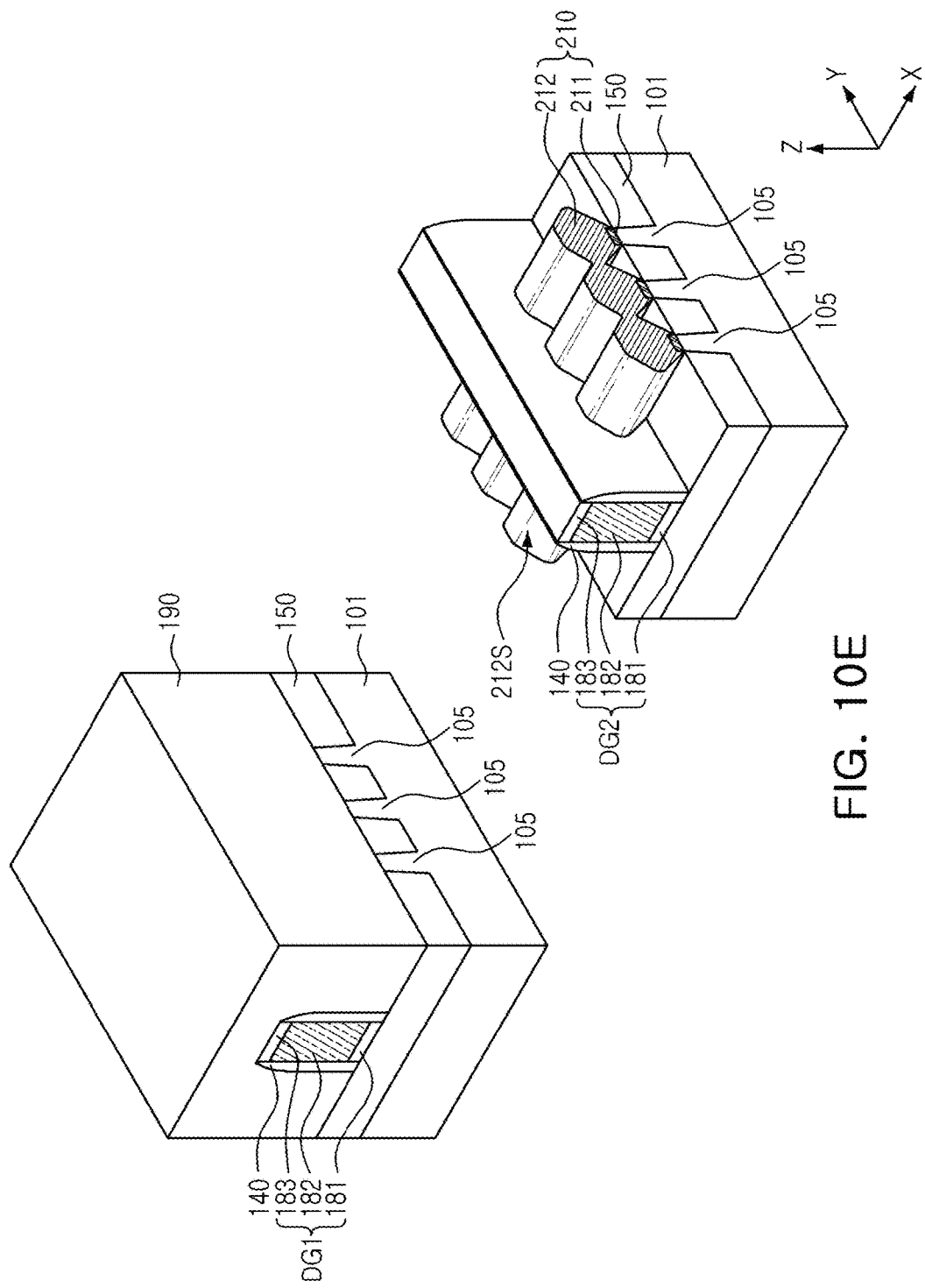
Figure 10F:
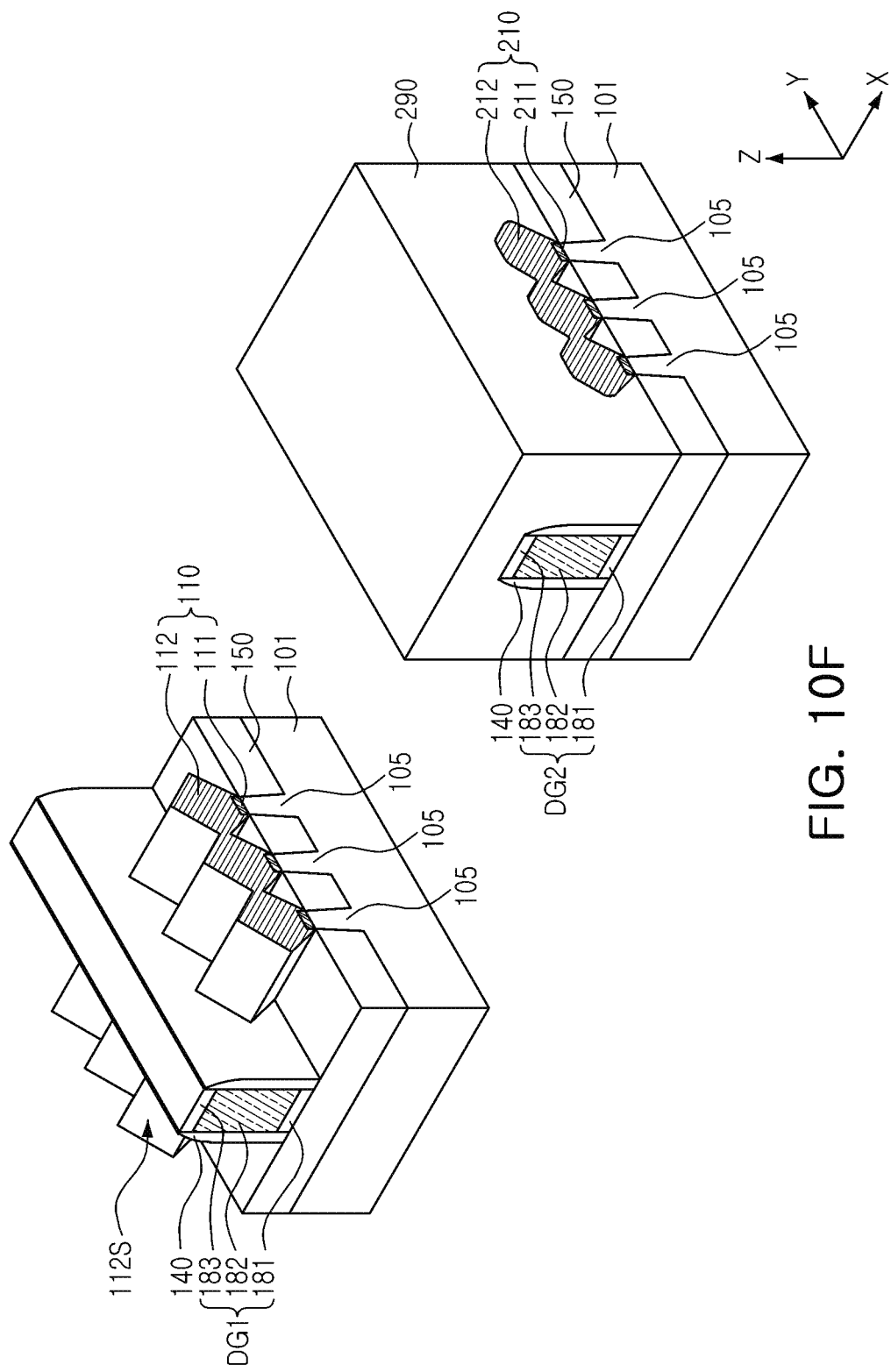
Figure 10G:
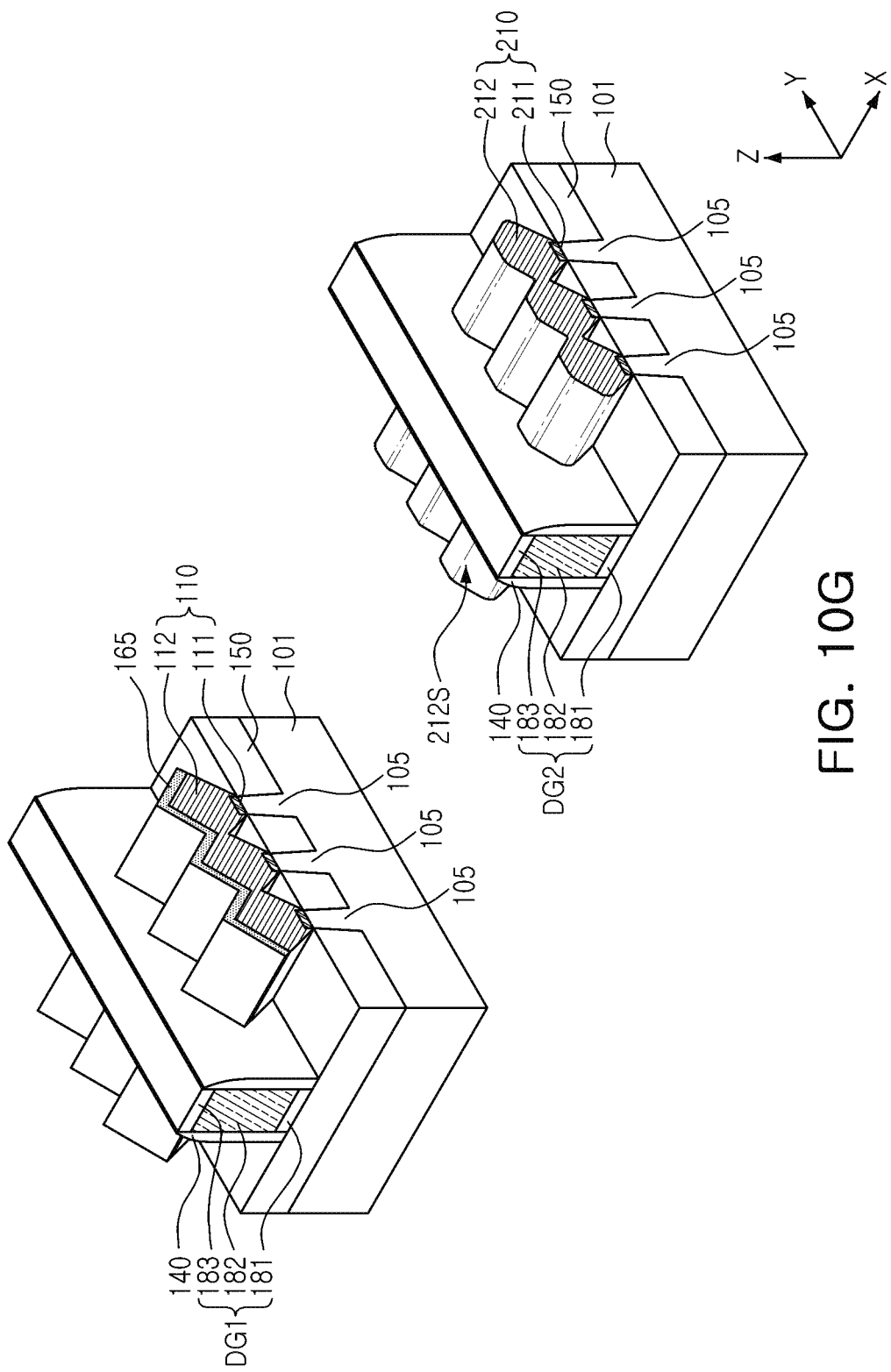
Figure 10H:
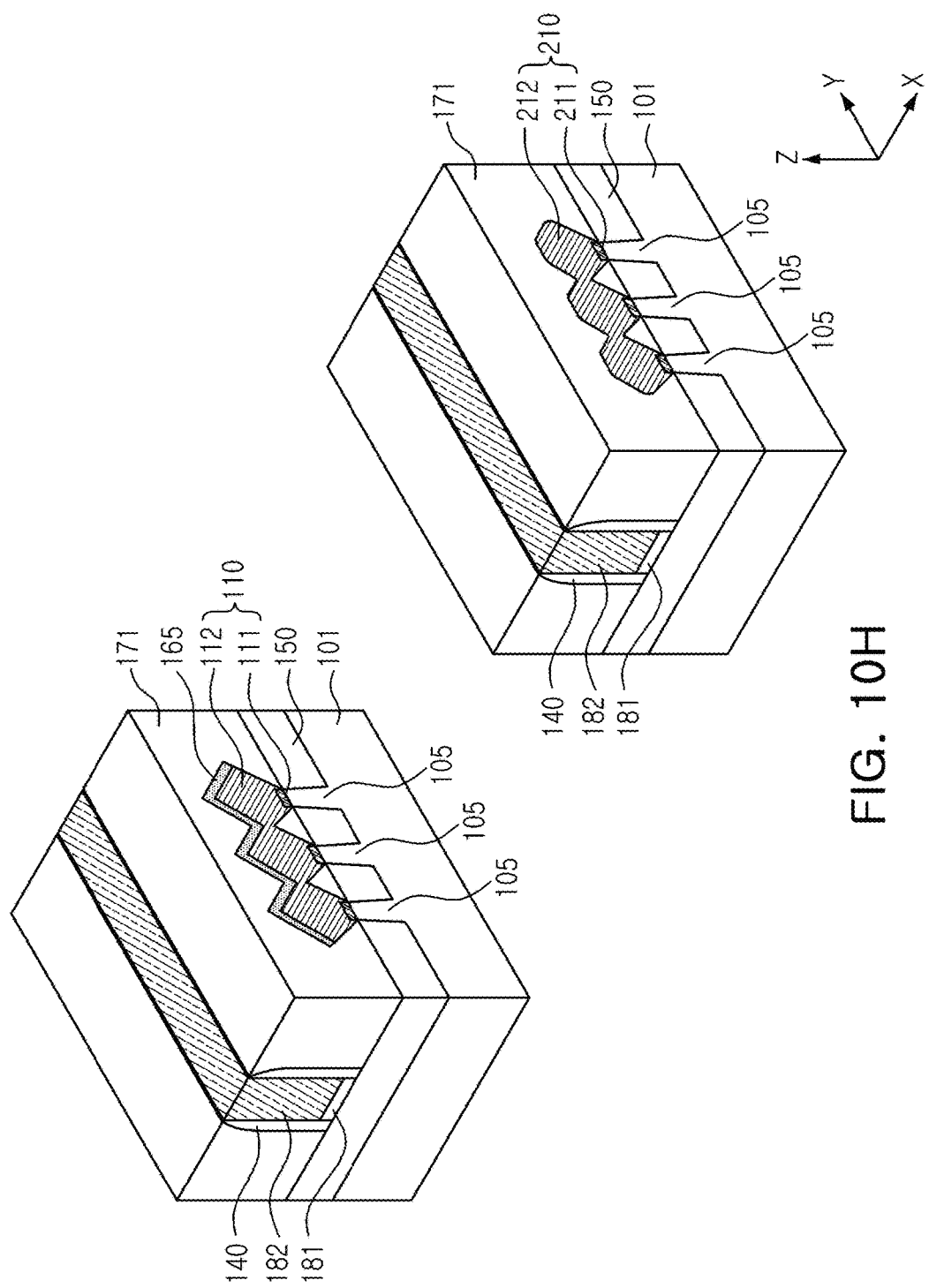
Figure 10I:
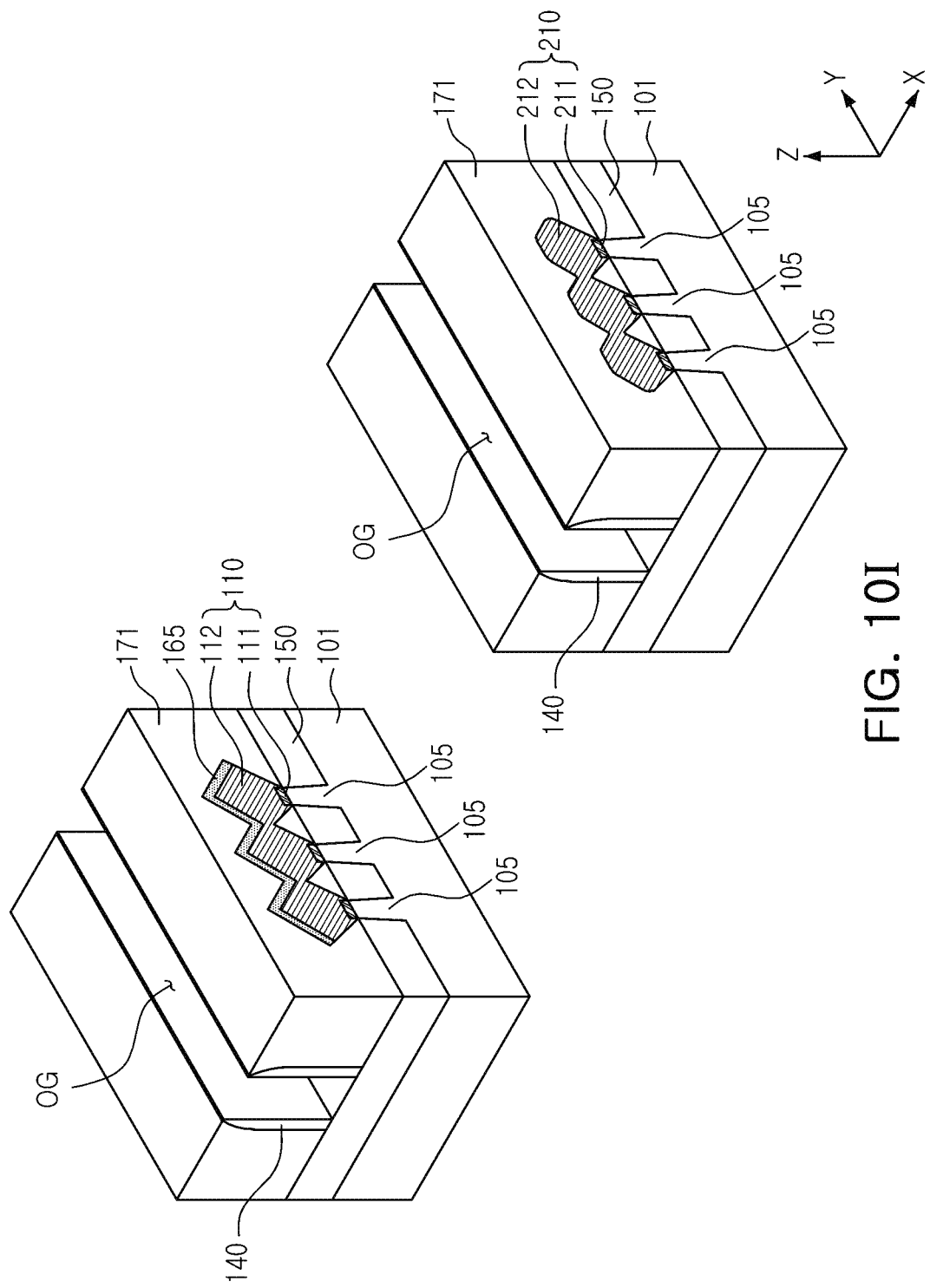
Figure 10J:
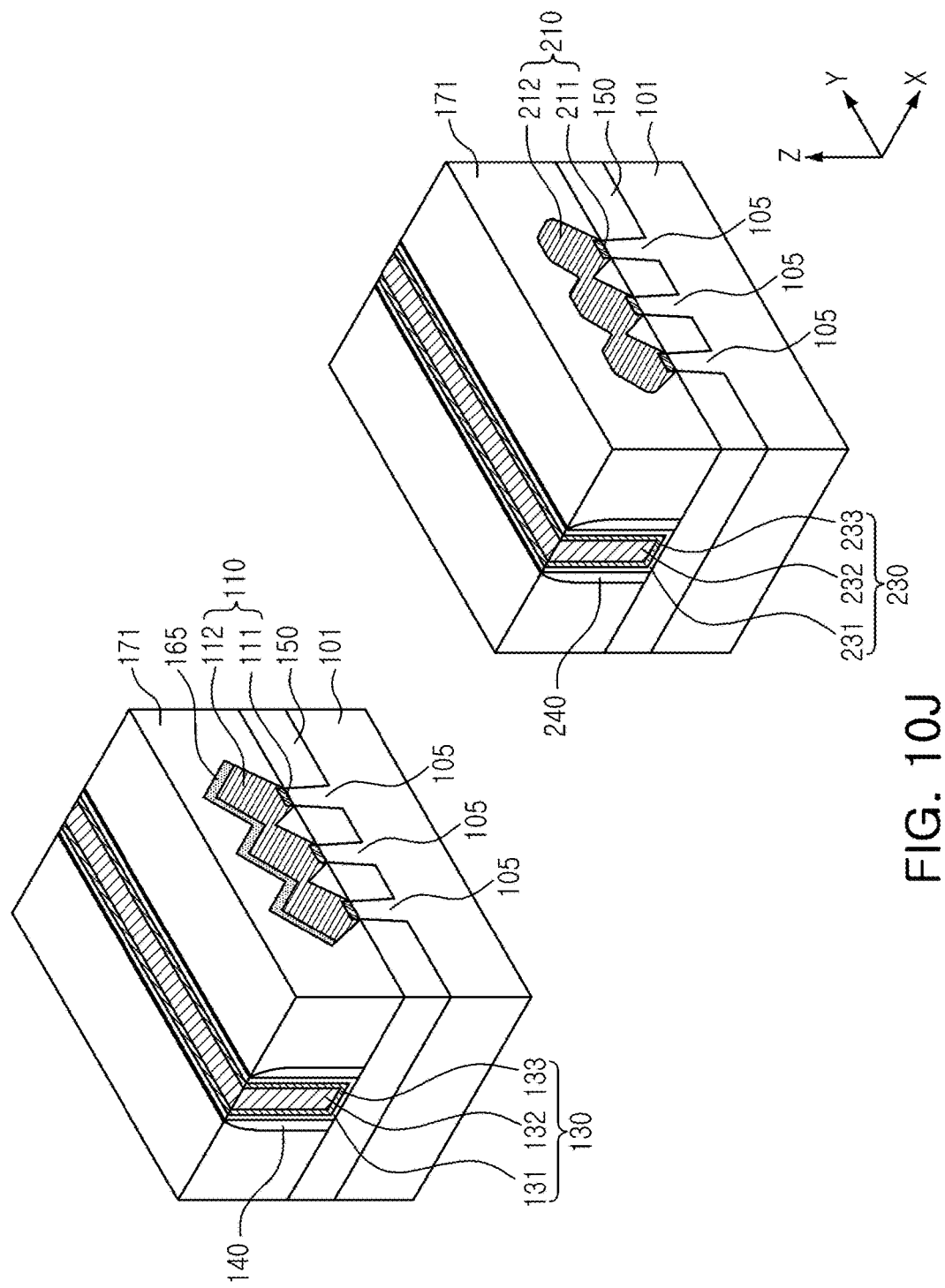
Figure 10K:
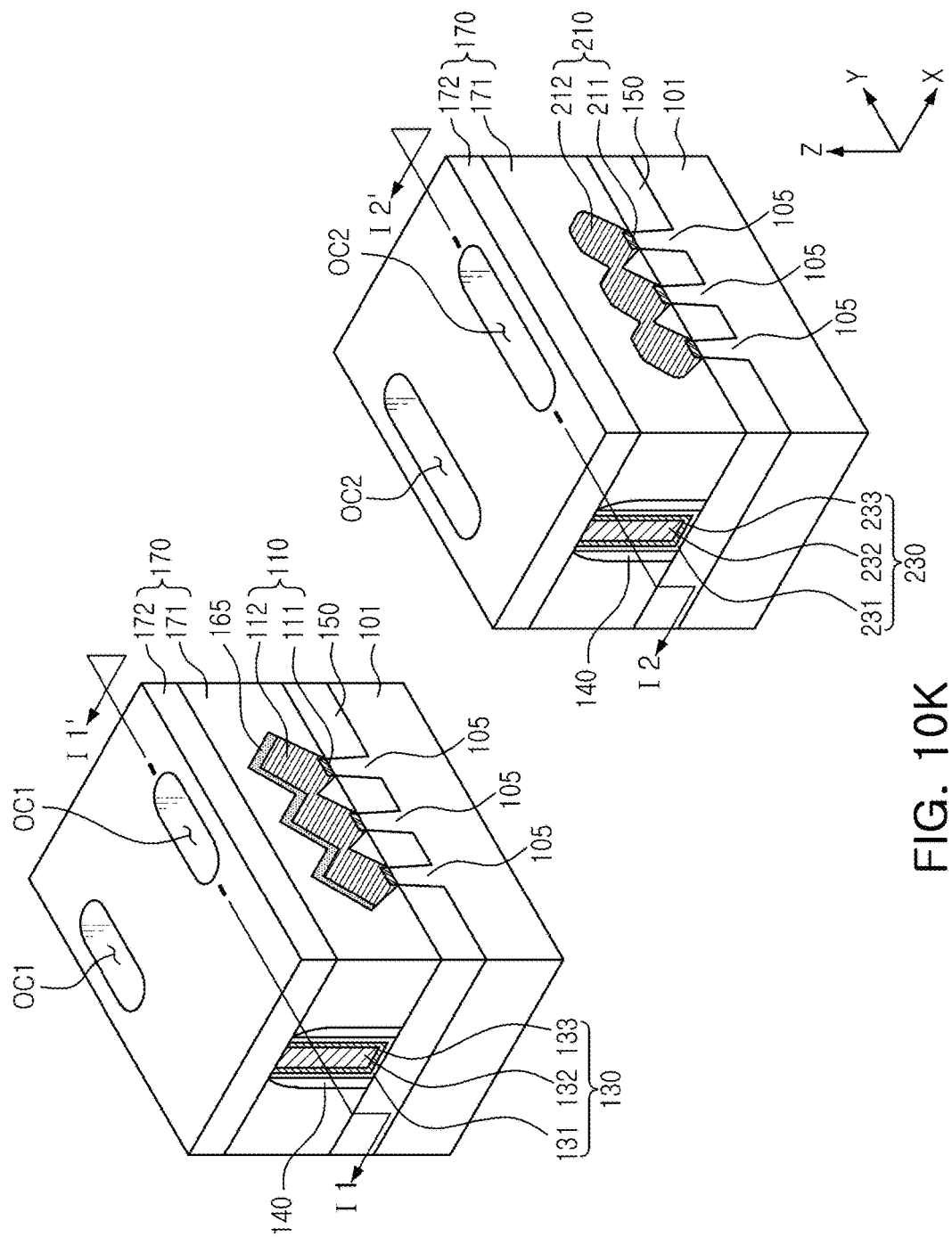

The first silicide layers 165 may function as an etch stop layer in a process of forming a contact hole in order to form the first contacts 190A (refer to FIG. 10K). As a result, the first source/drain regions 110 may not be removed, and a bent shape of the surfaces of the second regions 112 obtained by the SEG process may be maintained.

As shown in FIGS. 7 and 9A, the second semiconductor device 100B may include second silicide layers 262 disposed between the second source/drain regions 210 and the second contacts 190B. A formation area of the second silicide layers 262 may correspond to lower surfaces of the second contacts 190B, and may be dependent on an area of the second contacts 190B, unlike in the first silicide layers 165.

The second contacts 190B may be formed to be greater than the first contacts 190A, so as to secure a sufficient formation area of the second silicide layers 262. As in this exemplary embodiment, in the second direction (the Y direction), a length L2 of the second contacts 190B may be greater than a length L1 of the first contacts 190A.

The first silicide layers 165 may be formed on the entirety of the upper surfaces of the first source/drain regions 110 to increase a contact area, and thus, the first contacts 190A may be formed to have the length L1, shorter than the length L2 of the second contacts 190B. Thus, parasitic capacitance generated between the first contacts 190A and the first gate structure 130 may be reduced.

In the second semiconductor device 100B, recesses R may be formed in the second source/drain regions 210 in the process of forming a contact hole, in order to form the second contacts 190B. Such recesses R may increase a formation area of the second silicide layers 262. As described above, in the process of forming a contact hole, the first source/drain regions 110 may be hardly removed, while the second source/drain regions 210 may be partially removed, and thus, a height H1 of the first contacts 190A may be less than a height H2 of the second contacts 190B.

In this exemplary embodiment, the second silicide layers 262 may be an amorphous or polycystalline layer, unlike in the first silicide layers 165.

FIGS. 10A, 10B, 10C, 10D, 10E, 10F, 10G, 10H, 10I, 10J, 10K, and 10L are perspective views illustrating a method of manufacturing a semiconductor device according to an exemplary embodiment.

As shown in FIG. 10A, a substrate 101 may be patterned to form trenches TI defining a plurality of fin-type active regions 105.

Each of the fin-type active regions 105 may extend in a first direction (an X direction), and may be aligned in a second direction (a Y direction) substantially perpendicular to the first direction. The fin-type active regions 105 may be formed using a selective etching process using a pad oxide pattern 106 and a mask pattern 107 disposed on the substrate 101. The pad oxide pattern 106 may be a layer provided to protect the fin-type active regions 105. The mask pattern 107 may be a mask layer to pattern the substrate 101, and may include a silicon nitride layer, a carbon-containing material layer, or the like. The mask pattern 107 may also have a plurality of layers. When the trenches TI have a high aspect ratio, a width thereof may be narrower downwardly. Accordingly, a width of the fin-type active regions 105 may be narrowed upwardly.

As shown in FIG. 10B, a device isolation 150 filling at least portions of the trenches TI may be formed.

In order to form the device isolation 150, a process of filling the trenches TI with an insulating material and then planarizing the insulating material may be performed in advance. During the planarizing process, at least portions of the pad oxide pattern 106 and the mask pattern 107 may be removed together.

After the planarizing process, a process of allowing the fin-type active regions 105 to protrude from the substrate 101 by etching back the insulating material filling the trenches TI may be performed. This process may be performed using, for example, a wet etching process using at least a portion of the pad oxide pattern 106 as an etching mask. Accordingly, the fin-type active regions 105 may protrude upwardly by a predetermined height H3 which may vary. During the wet etching process, the pad oxide pattern 106 may also be removed. For example, the device isolations 150 may include a silicon oxide layer, a silicon nitride layer, a silicon oxynitride layer, or combinations thereof.

As shown in FIG. 10C, first and second dummy gate structures DG1 and DG2 and spacers 140 may be formed to intersect the fin-type active regions 105. The first dummy gate structure DG1 may be formed in a PMOS region, and the second dummy gate structure DG2 may be formed in an NMOS region. The first and second dummy gate structures DG1 and DG2 may extend in the second direction (the Y direction).

Each of the first and second dummy gate structures DG1 and DG2 may include a dummy gate insulating layer 181, a dummy gate metal layer 182, and a mask pattern layer 183. The dummy gate insulating layer 181 and the dummy gate metal layer 182 may be formed using an etching process using the mask pattern layer 183. The dummy gate insulating layer 181 may be formed of silicon oxide, and a dummy gate electrode may be formed of polycrystalline silicon. The spacers 140 may include silicon oxide, silicon nitride, or silicon oxynitride.

As shown in FIG. 10D, portions of the fin-type active regions 105 disposed on both sides of the spacers 140, i.e., a dummy gate structure, may be selectively removed.

This selective removal process may allow recessed portions to be formed in the fin-type active regions 105. After the formation of the recessed portions, the portions of the fin-type active regions 105 recessed through a separate process may be cured. This exemplary embodiment illustrates upper surfaces of the recessed portions as being substantially coplanar with upper surfaces of device isolations 150, but the present exemplary embodiment is not limited thereto. In another exemplary embodiment, the recessed portions may be higher or lower than the upper surfaces of the device isolations 150.

As shown in FIG. 10E, a first capping layer 190 may be formed on the substrate 101 disposed in the PMOS region to cover the first dummy gate structure DG1, and second source/drain regions 210 may be formed from the fin-type active regions 105 disposed in the NMOS region, using a SEG process.

The second source/drain regions 210 may include a silicon (Si) epitaxial layer. Each of the second source/drain regions 210 may include a first region 211 and a second region 212. The second region 212 may be grown on a crystallographically stable plane in a growth process thereof to have a cross section having a substantially hexagonal shape. For example, a surface 212S of the second region 212 may have a certain crystallographically stable crystal plane. When forming the second source/drain regions 210, an n-type impurity may be doped in-situ, or may be doped using a separate ion implantation process. For example, the n-type impurity may be phosphorus (P), nitrogen (N), arsenic (As), or antimony (Sb).

As shown in FIG. 10F, the first capping layer 190 may be removed to expose portions of the fin-type active regions 105 disposed in the PMOS region, and then, similarly to the first capping layer 190, a second capping layer 290 may be formed in the NMOS region.

Similar to the second source/drain regions 210, first source/drain regions 110 may be formed from the fin-type active regions 105 disposed in the PMOS region, using an SEG process. The first source/drain regions 110 formed in the PMOS region may include a silicon germanium (SiGe) epitaxial layer. A second region 112 of each of the first source/drain regions 110 may be grown on a crystallographically stable plane in a growth process thereof to have a cross section having a substantially pentagonal shape. For example, a surface 112S of a first region 111 of each of the first source/drain regions 110 may have a certain crystallographically stable crystal plane. When silicon germanium (SiGe) is grown on the fin-type active regions 105 formed of silicon (Si), compressive stress may occur. In an exemplary embodiment, the first region 111 may first be formed as a buffer for suppressing an occurrence of a defect due to a difference between lattice constants of the fin-type active regions 105, silicon (Si), and silicon germanium (SiGe). The first region 111 may have a relatively low germanium concentration within the second region 112.

When the first source/drain regions 110 disposed in the PMOS region are formed, a p-type impurity may be doped in-situ, or may be doped using a separate ion implantation process. For example, the p-type impurity may be boron (B), indium (In), gallium (Ga), or boron trifluoride ($BF_3$).

As shown in FIG. 10G, first silicide layers 165 may be formed on the first source/drain regions 110 disposed in the PMOS region.

The first silicide layers 165 may first be formed, and then, the second capping layer 290 may be removed. This silicizing process may be performed similarly to those illustrated in FIGS. 2C through 2F to form crystallized first silicide layers 165.

In detail, a metal layer may be deposited on a surface of each of the first source/drain regions 110. The surface may be a crystal plane obtained through a SEG process, i.e., a crystallographically stable plane. For example, the metal layer may include a composition of $Ni_{1-x}M_x$ (0<x<1), and M may include at least one of platinum (Pt), titanium (Ti), ruthenium (Ru), rhodium (Rh), cobalt (Co), hafnium (Hf), tantalum (Ta), erbium (Er), ytterbium (Yb), or tungsten (W). In a certain exemplary embodiment, the metal layer may include a composition of $Ni_{1-x}Pt_x$ (0.01<x<0.2). A PVD or CVD process may be used to deposit the metal layer. The metal layer may be allowed to react with the first source/drain regions 110 through a first annealing process to form a metal-rich silicide layer. The first annealing process may be performed at 200° C. to 350° C. A stripping process of removing non-reactive metal layers may be undertaken, and a second annealing process of crystallizing remaining amorphous silicide layers may be performed. In the second annealing process, an MSA process at a high temperature of 1,000° C. or higher may be used. Using the second annealing process, the first silicide layers 165 having a monocrystalline structure may be formed from the remaining amorphous silicide layers.

After the formation of the first silicide layers 165, the second capping layer 290 may be removed from the NMOS region.

As shown in FIG. 10H, a first interlayer insulating layer 171 may be formed over the PMOS region and the NMOS region.

The first interlayer insulating layer 171 may be formed of an insulating material to cover the first and second dummy gate structures DG1 and DG2 and the first and second source/drain regions 110 and 210. An upper surface of the dummy gate metal layer 182 may be allowed to be exposed, so that the first interlayer insulating layer 171 and the first and second dummy gate structures DG1 and DG2 may be planarized. For example, the first interlayer insulating layer 171 may include at least one of silicon oxide, silicon nitride, or silicon oxynitride.

As shown in FIG. 10I, the dummy gate metal layer 182 and the dummy gate insulating layer 181 may be removed to form a gate opening OG.

In this removal process, the spacers 140 and the fin-type active regions 105 may remain. As illustrated in FIG. 10I, the gate opening OG may be disposed between the spacers 140 to expose portions of the fin-type active regions 105. The exposed portions may be provided as a portion for a gate structure.

As shown in FIG. 10J, first and second gate structures 130 and 230 may be formed in the gate opening OG.

In this exemplary embodiment, the first and second gate structures 130 and 230 may have the same structure, and may be simultaneously formed. In another exemplary embodiment, portions of the first and second gate structures 130 and 230 may be formed of different materials.

The first and second gate structures 130 and 230 may include gate insulating layers 131 and 231, first gate metal layers 132 and 232, and second gate metal layers 133 and 233, respectively. The gate insulating layers 131 and 231 may be substantially conformally formed on internal side surfaces and a lower surface of the gate opening OG, and may include oxide, nitride, or a high-k dielectric material. The first gate metal layers 132 and 232 and the second gate metal layers 133 and 233 may include a metal or a semiconductor material, and may be formed of different materials.

As shown in FIG. 10K, a second interlayer insulating layer 172 may be formed on the first interlayer insulating layer 171, and first and second contact openings OC1 and OC2 passing through an interlayer insulating layer 170 may be formed in the PMOS and NMOS regions, respectively.

Similar to the first interlayer insulating layer 171, the second interlayer insulating layer 172 may include an insulating material. The first and second contact openings OC1 and OC2 may be simultaneously formed, or may also be formed using different etching processes. In an exemplary embodiment, the first contact openings OC1 may first be formed by forming a mask layer that opens only regions corresponding to the first contact openings OC1. After the formation of the first contact openings OC1, the second contact openings OC2 may be formed by forming a mask layer that opens only regions corresponding to the second contact openings OC2. In an exemplary embodiment, the second contact openings OC2 may also be formed before the first contact openings OC1.

Each of the first and second contact openings OC1 and OC2 may have a width in the X direction and a length in the Y direction less than those of the first and second source/drain regions 110 and 210.

Figure 11A:
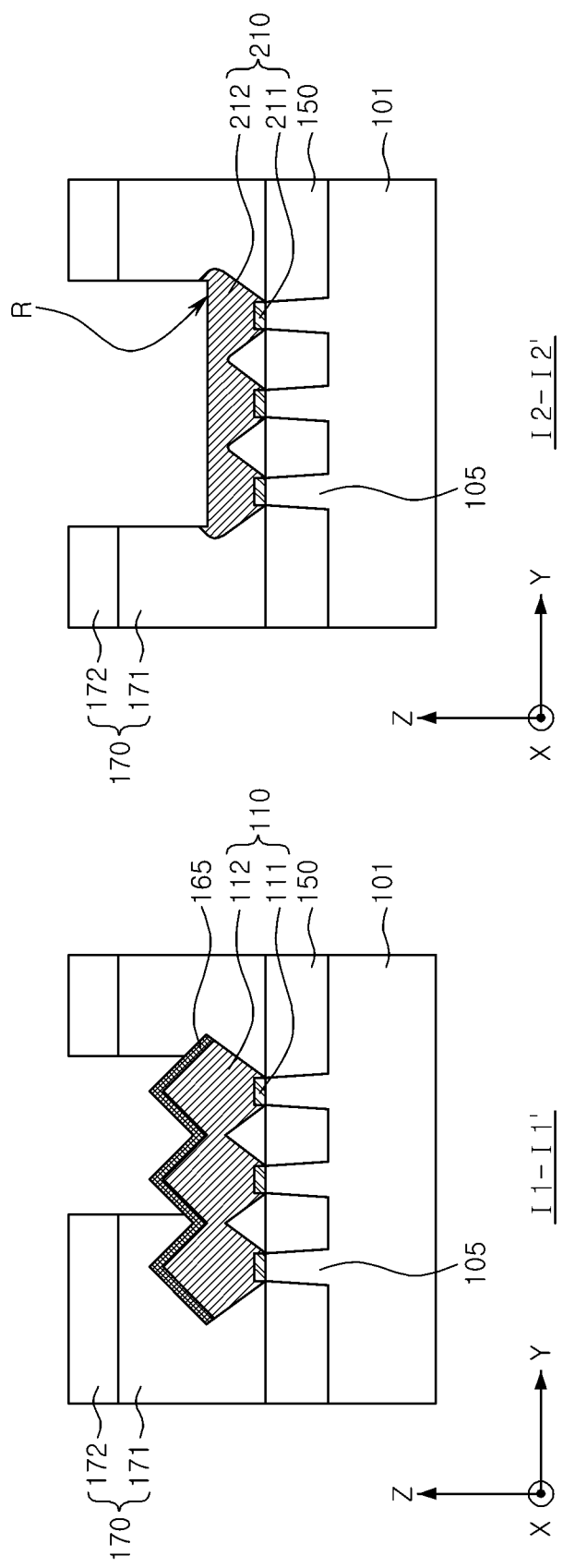
FIGS. 11A to 11C are cross-sectional views illustrating processes in a method of manufacturing a semiconductor device according to an exemplary embodiment.

FIG. 11A shows cross-sectional views taken along lines I1-I1' and I2-I2' of the product illustrated in FIG. 10K.

As shown in FIG. 11A, the first silicide layer 165 may be exposed by the first contact opening OC1, and the second source/drain region 210 may be exposed by the second contact opening OC2.

In the process of forming the first contact opening OC1, the first silicide layer 165 may function as an etch stop layer to protect the first source/drain region 110. As a result, the first source/drain region 110 may be allowed to substantially maintain the shape obtained by the SEG process. In the process of forming the second contact opening OC2, a recess R may be formed in an upper surface of the second source/drain region 210 in the second contact opening OC2. Such a recess R may widen a contact area of the second source/drain region 210. A bottom surface of the recess R is illustrated as being relatively flat, but the recess R may have a less flat surface, or a curved surface, according to etching conditions or the like.

Figure 11B:
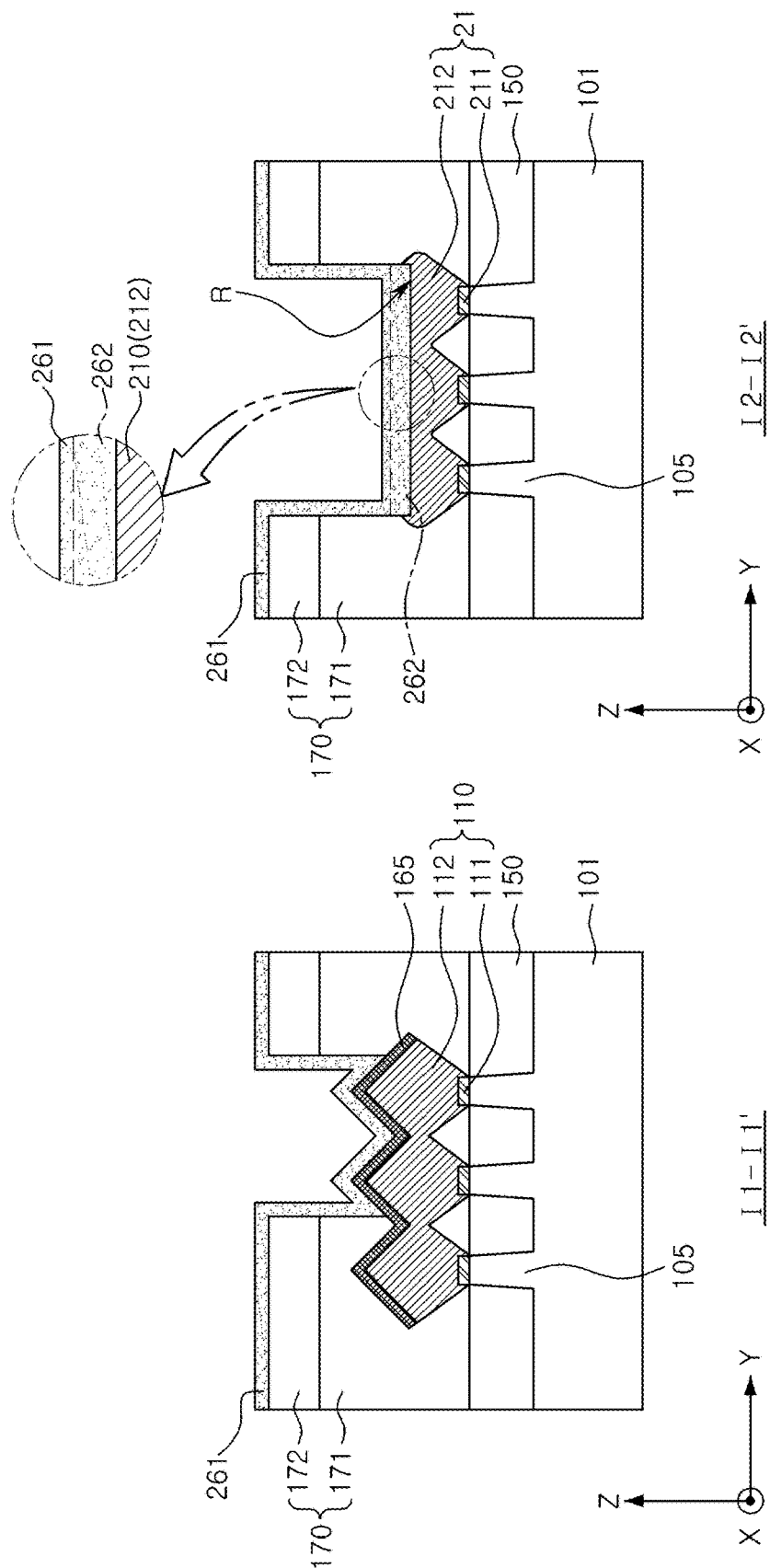
Figure 11C:
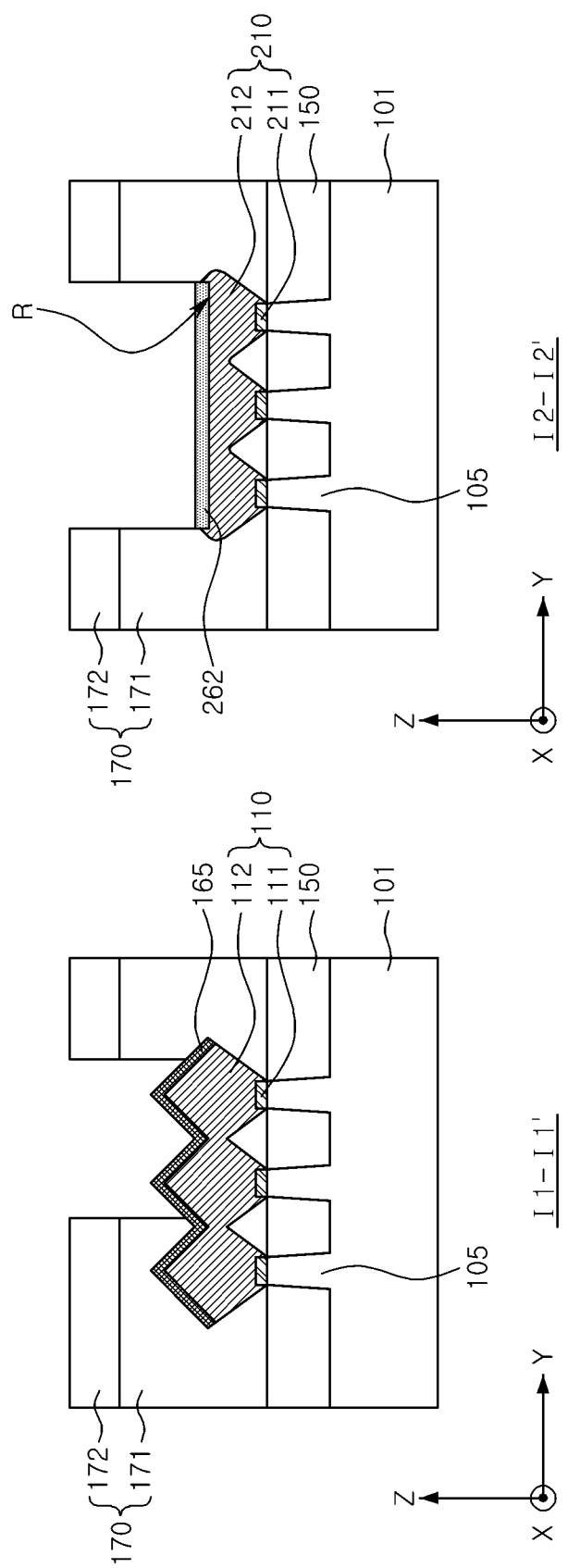

As illustrated in FIGS. 11B and 11C, a second silicide layer 262 may be formed on the second source/drain regions 210.

As shown in FIG. 11B, a metal layer 261 for silicization may be deposited, and an annealing process for a reaction between the metal layer 261 and silicon (Si) may be performed. Even when the metal layer 261 is deposited on substantially the entirety of the second source/drain region 210, the metal layer 261 may contact silicon (Si) only in an exposed portion of the second source/drain region 210. Thus, the second silicide layer 262 may only be formed on the exposed portion of the second source/drain region 210.

As illustrated in FIG. 11C, a non-reactive portion of the metal layer 261 may be selectively removed through a stripping process such as a wet etching process, so that only the second silicide layer 262 formed on the exposed portion of the second source/drain region 210 may remain. The second silicide layer 262 may be subjected to a preceding high-temperature annealing process for a gate insulating layer, a high-k dielectric, and thus, may not be crystallized, as long as a desired level of contact resistance is secured.

Figure 10L:
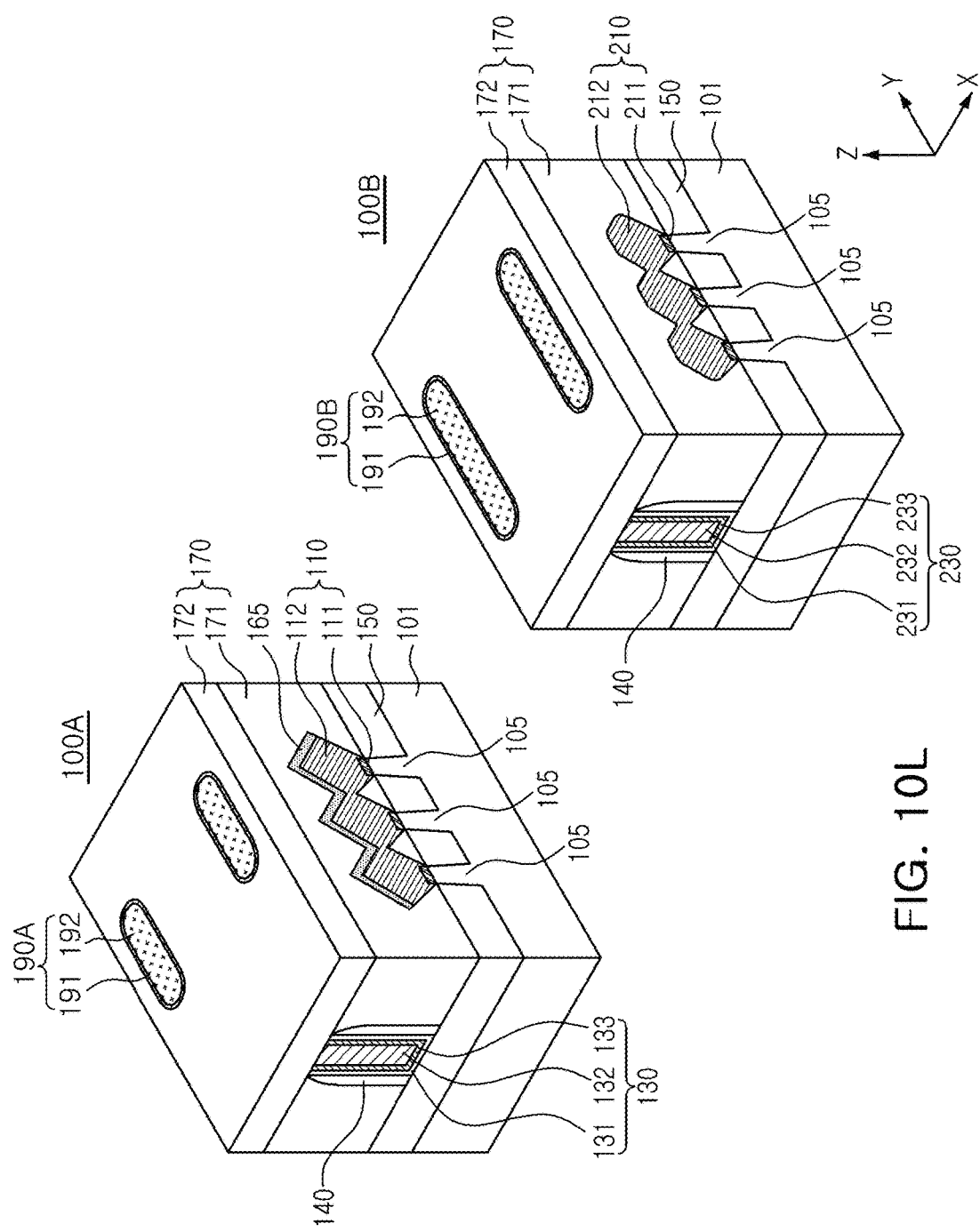

As shown in FIG. 10L, first and second contacts 190A and 190B may be formed by filling the first and second contact openings OC1 and OC2 with conductive materials. The first and second contacts 190A and 190B may have a similar structure to each other, and may be formed together using an identical process.

Each of the first and second contacts 190A and 190B may include a conductive barrier layer 191 preventing diffusion of a material of the contact plugs 192. For example, the conductive barrier layer 191 may be formed using an ALD or CVD process, and may include titanium nitride (TiN), tantalum nitride (TaN), or tungsten nitride (WN). The contact plugs 192 may include aluminum (Al), copper (Cu), tungsten (W), or molybdenum (Mo).

In the foregoing exemplary embodiment, prior to the formation of the first interlayer insulating layer 171, the crystallized silicide layer may be formed in the PMOS region, and after the formation of the gate structure, the amorphous or polycrystalline silicide layer may be formed in the NMOS region. Conversely, prior to the formation of the first interlayer insulating layer 171, the crystallized silicide layer may be formed in both the PMOS region and the NMOS region.

For example, prior to the formation of the first interlayer insulating layer 171, when the crystallized silicide layer is formed in the NMOS region, the crystallized silicide layer may provide tensile stress, thus contributing to improving a degree of mobility of electrons.

Figure 12:
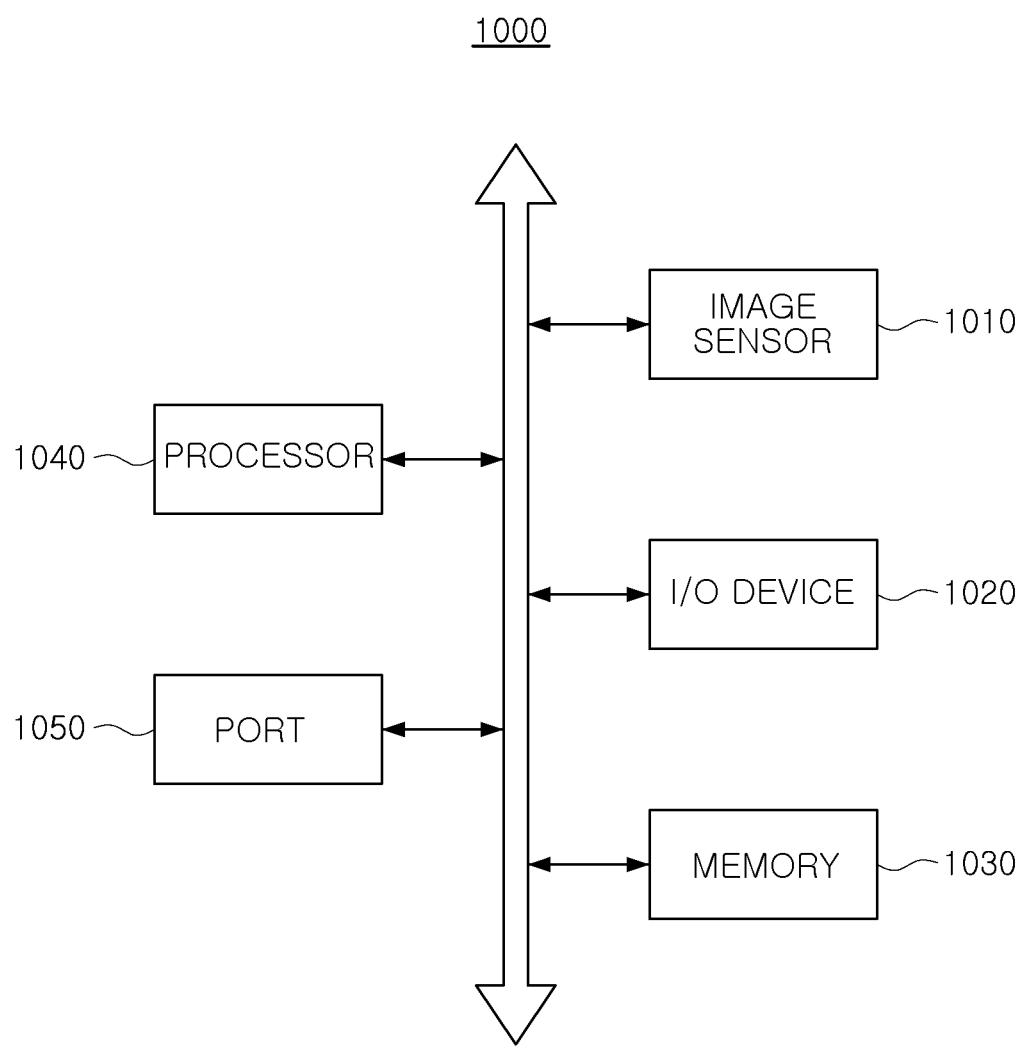
FIG. 12 is a block diagram of an electronic device including a semiconductor device according to an exemplary embodiment.

FIG. 12 is a block diagram of an electronic device including a memory device according to an exemplary embodiment.

As shown in FIG. 12, the semiconductor device 10, 100A, or 100B according to an exemplary embodiment may be applied to a computer device 1000. The computer device 1000 according to an exemplary embodiment may include an image sensor 1010, an input/output (I/O) device 1020, a memory 1030, a processor 1040, and a port 1050. In detail, the semiconductor devices 10, 100A, or 100B may be applied to the image sensor 1010, the memory 1030, or the processor 1040. The computer device 1000 may further include a wire/wireless communications device, a power supply, and the like.

Among the components illustrated in FIG. 12, the port 1050 may be provided for the computer device 1000 to communicate with a video card, a sound card, a memory card, a universal serial bus (USB) device, and the like. The computer device 1000 may include a smartphone, a tablet personal computer (PC), or a smart wearable device, in addition to a general desktop PC or laptop PC.

The processor 1040 may perform a certain operation, a command, a task, and the like. The processor 1040 may be a central processing unit (CPU) or a microprocessor unit (MCU), and may communicate with other devices connected to the memory 1030, the I/O device 1020, the image sensor 1010, and the port 1050 through a bus 1060.

The memory 1030 may be a storage medium storing data necessary for operations of the computer device 1000, or multimedia data. The memory 1030 may include a volatile memory such as a random access memory (RAM) or a non-volatile memory such as a flash memory. In addition, the memory 1030 may include at least one of a solid state drive (SSD), a hard disk drive (HDD), and an optical disk drive (ODD), as a storage device. The I/O device 1020 may include input devices such as a keyboard, a mouse, and a touch screen and output devices such as a display and an audio output unit provided to a user.

The image sensor 1010 may have a sensor circuit having a plurality of transistors, and the sensor circuit may be implemented as the semiconductor device 10, 100A, or 100B according to an exemplary embodiment. The semiconductor device 10 according to an exemplary embodiment may also be applied to circuits included in the processor 1040 or the memory 1030.

As set forth above, according to exemplary embodiments of the present inventive concept, low-resistance contact characteristics may be retained in a subsequent process at a high temperature of, for example, 350° C. or higher by forming a metal silicide layer having an ordered crystallinity. Thus, a metal silicide layer having excellent thermal stability may be provided over a wide area of a surface of a source/drain region prior to formation of an interlayer insulating layer. The metal silicide layer as a monocrystalline layer may be used as an element applying tensile stress.

While exemplary embodiments have been shown and described above, it will be apparent to those skilled in the art that modifications and variations could be made without departing from the scope of the present inventive concept, as defined by the appended claims.

What is claimed is:

1. A semiconductor device comprising:
a substrate having an active region;
a gate structure disposed on the active region;
source/drain regions respectively formed within portions of the active region at both sides of the gate structure;
metal silicide layers, each disposed on a surface of a respective one of the source/drain regions and each having a monocrystalline structure; and
contact plugs disposed on the source/drain regions and electrically connected to respective ones of the source/drain regions through respective ones of the metal silicide layers, respectively,
wherein the source/drain regions are formed of crystalline silicon germanium (SiGe), and the metal silicide layers are formed of a crystalline composition comprising germanium (Ge).

2. The semiconductor device of claim 1, wherein the crystalline composition of the metal silicide layers include a composition formed of Si, Ge, nickel (Ni) and at least one of platinum (Pt), titanium (Ti), ruthenium (Ru), rhodium (Rh), cobalt (Co), hafnium (Hf), tantalum (Ta), erbium (Er), ytterbium (Yb), and tungsten (W).

3. The semiconductor device of claim 2, wherein the crystalline composition of the metal silicide layers include a composition formed of Si, Ge, Ni and Pt.

4. The semiconductor device of claim 2, wherein the monocrystalline structure of the metal silicide layers is an orthorhombic crystal system.

5. The semiconductor device of claim 1, wherein the active region has a fin-shaped active region extending in a first direction, and the gate structure extends in a second direction, substantially perpendicular to the first direction, to cross over the fin-shaped active region, and the source/drain regions are formed on portions of the fin-shaped active region at both sides of the gate structure, respectively.

6. The semiconductor device of claim 5,
wherein the source/drain regions have a raised structure obtained by selective epitaxial growth, and the metal silicide layers are disposed respectively in contact with an upper surface of the raised structure of a corresponding one of the source/drain regions.

7. A semiconductor device comprising:
a substrate having a first device region and a second device region;
a first transistor formed in the first device region; and
a second transistor formed in the second device region,
wherein each of the first transistor and the second transistor includes:
a fin-shaped active region extending in a first direction;
a gate line extending in a second direction, substantially perpendicular to the first direction, to cross over the fin-shaped active region;
source/drain regions respectively formed on portions of the fin-shaped active region at both sides of the gate line;
metal silicide layers formed on surfaces of respective ones of the source/drain regions; and
contact plugs disposed on the source/drain regions and electrically connected to respective ones of the source/drain regions through a respective one of the metal silicide layers, respectively,
wherein the metal silicide layers of the first transistor are each a monocrystalline layer, and the metal silicide layers of the second transistor are each an amorphous or polycrystalline layer.

8. The semiconductor device of claim 7, wherein the metal silicide layers of the first transistor are formed of a composition including Si, Ge, Ni and Pt and have an orthorhombic-system crystal structure.

9. The semiconductor device of claim 7, wherein the source/drain regions of the first transistor have a raised structure obtained by selective epitaxial growth, and the metal silicide layers of the first transistor are disposed in contact with a corresponding upper surface of the raised structure of a corresponding one of the source/drain regions, and each of the source/drain regions of the second transistor has an upper surface in which a recess is formed, and the metal silicide layers of the second transistor are disposed on a side surface of a respective one of the recesses.

10. The semiconductor device of claim 7, wherein the contact plugs of the first transistor have a length less than a length of the contact plugs of the second transistor in the second direction.

11. The semiconductor device of claim 7,
wherein the source/drain regions of the first transistor include silicon germanium (SiGe) and a charge carrier dopant of a first type, and the source/drain regions of the second transistor include silicon (Si) and a charge carrier dopant of a second type,
wherein the source/drain regions of the second transistor do not include silicon germanium (SiGe).

12. The semiconductor device of claim 7, wherein each of the metal silicide layers of each of the first transistor and the second transistor is a monocrystalline layer.

13. A semiconductor device, comprising:
a first fin-shaped active region;
a gate structure disposed on the first fin-shaped active region;
first and second epitaxial source/drain regions formed on the first fin-shaped active region;
first and second monocrystalline compound layers respectively formed on said first and second epitaxial source/drain regions, each of the first and second monocrystalline compound layers comprising an intrinsic semiconductor material and at least one metal element; and
first and second contact plugs respectively disposed on the first and second epitaxial source/drain regions and respectively in contact with the first and second monocrystalline compound layers
wherein the first fin-shaped active region extends in a first direction, and the gate structure extends in a second direction, substantially perpendicular to the first direction, to cross over the fin-shaped active region, and the first and second epitaxial source/drain regions are formed on portions of the fin-shaped active region at both sides of the gate structure, respectively, and
wherein the first and second epitaxial source/drain regions have a raised structure obtained by selective epitaxial growth, and the monocrystalline compound layers are disposed respectively in contact with an upper surface of the raised structure of a corresponding one of the first and second epitaxial source/drain regions.

14. The semiconductor device of claim 13, wherein each of said first and second epitaxial source/drain regions include a silicon germanium (SiGe) epitaxial layer.

15. The semiconductor device of claim 13, wherein said first and second epitaxial source/drain regions have a polygonal shape.

16. The semiconductor device of claim 13, wherein the semiconductor device comprises a PMOS transistor and said first and second epitaxial source/drain regions comprise source/drain regions of the PMOS transistor.

17. The semiconductor device of claim 13, wherein the first and second monocrystalline compound layers include a composition of $Ni_{1-x}M_xSi(0<x<1)$, where M includes at least one of platinum (Pt), titanium (Ti), ruthenium (Ru), rhodium (Rh), cobalt (Co), hafnium (Hf), tantalum (Ta), erbium (Er), ytterbium (Yb), or tungsten (W).

18. The semiconductor device of claim 17, wherein the first and second monocrystalline compound layers are formed of Ni, Pt, and Si.

19. The semiconductor device of claim 13, wherein the first and second monocrystalline compound layers are formed of Ni, Pt, Si and Ge.

* * * * *